(12) United States Patent
Chui et al.

(10) Patent No.: US 7,271,458 B2
(45) Date of Patent: Sep. 18, 2007

(54) HIGH-K DIELECTRIC FOR THERMODYNAMICALLY-STABLE SUBSTRATE-TYPE MATERIALS

(75) Inventors: Chi On Chui, San Mateo, CA (US); Krishna C. Saraswat, Saratoga, CA (US); Baylor B. Triplett, La Honda, CA (US); Paul McIntyre, Sunnyvale, CA (US)

(73) Assignee: The Board of Trustees of the LeLand Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/404,876

(22) Filed: Mar. 31, 2003

(65) Prior Publication Data

US 2007/0170541 A1  Jul. 26, 2007

Related U.S. Application Data

(63) Continuation-in-part of application No. PCT/US02/11785, filed on Apr. 15, 2002.

(51) Int. Cl.
*H01L 29/76* (2006.01)
(52) U.S. Cl. ...................... 257/410; 257/411
(58) Field of Classification Search ................ 257/410, 257/411, 310, 295, 382, 385
See application file for complete search history.

(56) References Cited

U.S. PATENT DOCUMENTS

| 4,879,256 | A | 11/1989 | Bean et al. |
|---|---|---|---|
| 4,959,694 | A | 9/1990 | Gell |
| 5,646,058 | A | 7/1997 | Taur et al. |
| 6,214,712 | B1 | 4/2001 | Norton |
| 6,335,238 | B1 | 1/2002 | Hanttangady et al. |
| 6,403,434 | B1 * | 6/2002 | Yu .............................. 438/300 |
| 6,455,330 | B1 * | 9/2002 | Yao et al. ....................... 438/3 |
| 6,486,520 | B2 * | 11/2002 | Okuno et al. ............... 257/410 |
| 6,495,437 | B1 * | 12/2002 | Yu .............................. 438/591 |

FOREIGN PATENT DOCUMENTS

WO     WO03/096390     * 11/2003

* cited by examiner

*Primary Examiner*—Sara Crane
(74) *Attorney, Agent, or Firm*—Crawford Maunu PLLC

(57) ABSTRACT

Excellent capacitor-voltage characteristics with near-ideal hysteresis are realized in a capacitive-like structure that uses an electrode substrate-type material with a high-k dielectric layer having a thickness of a few-to-several Angstroms capacitance-based $SiO_2$ equivalent ("$T_{Ox, Eq}$"). According to one particular example embodiment, a semiconductor device structure has an electrode substrate-type material having a Germanium-rich surface material. The electrode substrate-type material is processed to provide this particular electrode surface material in a form that is thermodynamically stable with a high-k dielectric material. A dielectric layer is then formed over the electrode surface material with the high-k dielectric material at a surface that faces, lies against and is thermodynamically stable with the electrode surface material.

25 Claims, 20 Drawing Sheets

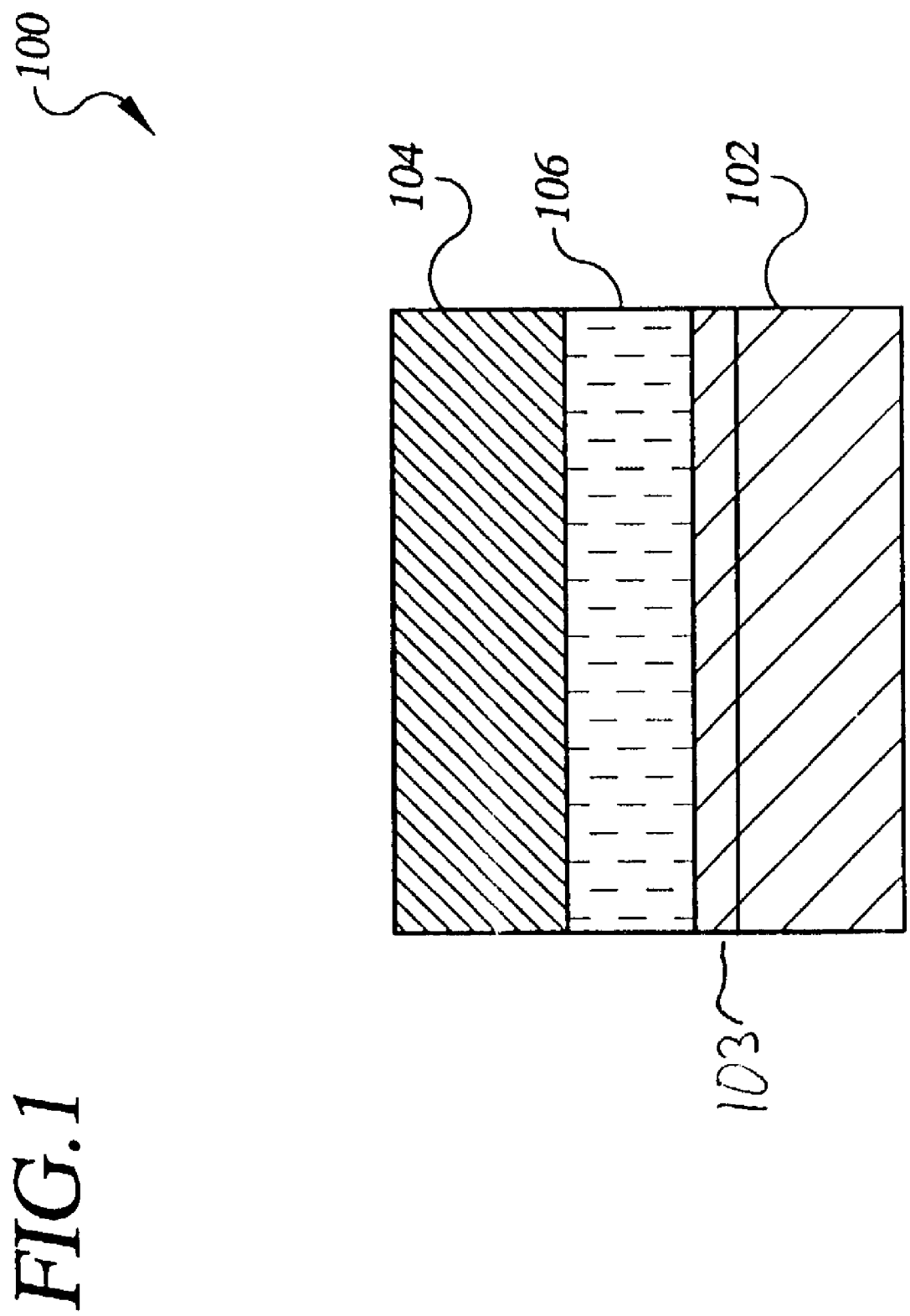

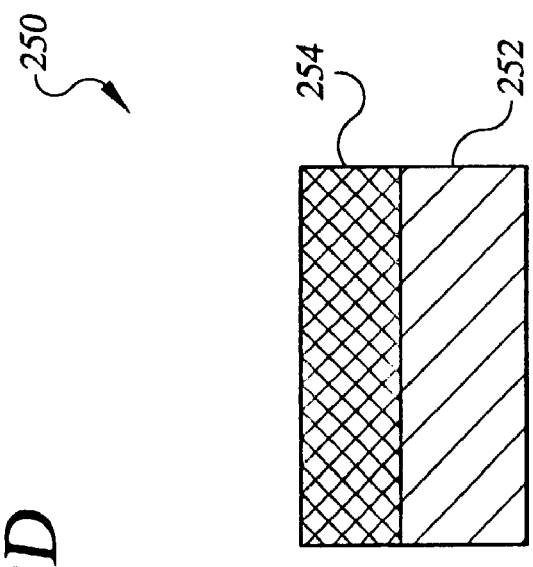
*FIG.2D*
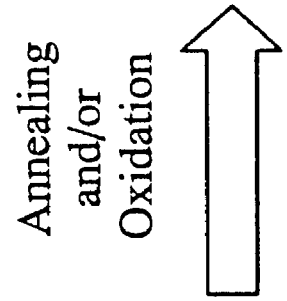
Annealing and/or Oxidation
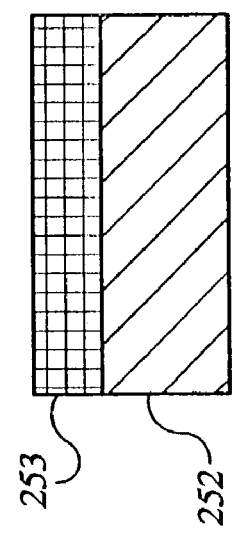
*FIG.2C*

HIGH-K DIELECTRIC FOR THERMODYNAMICALLY-STABLE SUBSTRATE-TYPE MATERIALS

RELATED PATENT DOCUMENTS

This is a continuation-in-part of PCT Patent Application No. PCT/US02/11785, entitled "High-K Dielectric for Thermodynamically-stable Substrate-type Materials" and having an international filing date of Apr. 15, 2002, to which priority is claimed under 35 U.S.C. § 120 for common subject matter.

FEDERALLY SPONSORED RESEARCH OR DEVELOPMENT

This invention was made with Government support under contract MDA 972-00-1-0013 awarded by NIH/U.S. Department of Defense/Advanced Research Projects Agency. The U.S. Government has certain rights in this invention.

FIELD OF THE INVENTION

The present invention is directed to electronic semiconductor devices and, more specifically, to electronic semiconductor devices having capacitive structures with ultra-thin, high-permittivity (high-k) dielectric layers.

BACKGROUND

Various types of electronic semiconductor devices employ capacitive structures to effect proper circuit operation. Examples of such devices include, among others, insulated-gate field-effect transistors (IGFETs), insulated-gate thyristors, discrete capacitors and various types of optics devices. In the commonly-used IGFET, for example, a gate controls an underlying surface channel joining a source and a drain. The channel, source and drain are typically located in a semiconductor substrate material, with the source and drain being doped oppositely to the substrate material and located on either side of the channel. The gate is separated from the semiconductor substrate material by a thin insulating layer such as a gate oxide having a substantially uniform thickness. To operate the IGFET, an input voltage is applied to its gate and, through the capacitive structure defined by the electrode material on either side of the gate oxide, this input voltage causes a transverse electric field in the channel. This field then modulates the longitudinal conductance of the channel to electrically couple source and drain regions.

Various benefits can be realized by reducing the dimensions of such electronic semiconductor devices. One benefit is the ability to increase the number of individual devices that can be placed onto a single silicon chip or die without increasing its relative size. Also, increasing the number of individual devices, especially IGFETs, leads to increased functionality. Yet another benefit is increased speed of the individual devices as well as their collective arrangements.

For decades now, the semiconductor industry has been realizing these size-reduction benefits using silicon substrates at a tremendous rate, as exemplified by the electrical performance of MOS-type (metal-oxide-semiconductor) silicon-based IGFETs doubling every 2 to 3 years. However, the International Technology Roadmap for Semiconductors (ITRS) notes that "traditional scaling" of such silicon-based IGFETs (e.g., planar bulk Si-MOS structures) is beginning to face limits to this continued progress. The extent to which the semiconductor industry can drive this scaling of silicon-based IGFET devices is unknown, but there is agreement that the current rate of technology evolution permits only about 4 more technological-advancement nodes of this "classical" silicon-based approach.

Scaling to 4 more technology nodes would lead to effective feature sizes of approximately 20-30 nm. However, achieving even this objective would require significant technological breakthroughs. Beyond this point, there is generally industry-wide agreement that traditional silicon-based IGFET technology would likely have to be replaced by future innovations, including new materials and devices. As such, an entirely new and different era and area of technology would have to be introduced.

One such very promising material is Germanium (Ge) because of its very high carrier mobility. In the past few decades, researchers have been trying to build MOS-type transistors and capacitors using Germanium (Ge) and silicon-Germanium (SiGe) for integrated electronic and/or optical circuit applications, due to some of its superior qualities to silicon (Si). However, various problems with Ge or SiGe have frustrated these efforts. For example, the lack of a sufficiently stable native oxide for the Ge has undermined the ability to passivate the Ge or SiGe surface and form a gate dielectric material for MOS-type devices.

SUMMARY

The present invention is directed to the above and related types of circuit devices and their manufacture and involving capacitive-like structures with substrate-like material facing a dielectric layer including a high-k dielectric that is thermodynamically stable with the substrate-type material. The present invention is exemplified in a number of implementations and applications, some of which are summarized below.

In connection with one aspect of the present invention, it has been discovered that excellent capacitor-voltage characteristics with near-ideal hysteresis can be realized in such a structure with a capacitance-based equivalent $SiO_2$ thickness ("$T_{Ox,Eq}$") of less than about 10 Angstroms and, in other instances, less than about 5 Angstroms.

According to one example embodiment of the present invention, a semiconductor electronics device includes a Germanium-based (Ge-based) surface material having a composition that is preponderantly Germanium, and a dielectric layer having a relatively thin $T_{Ox,Eq}$. The high-k dielectric surface material faces, lies against and is thermodynamically stable with the Ge-based surface material. In certain specific embodiments, the dielectric layer is less than 10 Angstroms $T_{Ox,Eq}$ (equivalent oxide thickness) and, in other embodiments, less than 5 Angstroms $T_{Ox,Eq}$.

In another example embodiment of the present invention, a semiconductor electronics device includes a capacitive structure having first and second electrode layers on either side of a dielectric layer. The first electrode, using, e.g., metal or a semiconductor-like material such as heavily-doped polysilicon, provides a gate or control node to the capacitive structure. The second electrode layer for the capacitive structure includes a Ge-rich surface material facing the first electrode layer, and the dielectric layer has a thickness that is sufficient (e.g., less than about 10 Angstroms $T_{Ox,Eq}$) to passivate the Ge-rich surface material. The dielectric layer further includes a high-k dielectric surface material that faces, lies against and is thermodynamically stable with the Ge-rich surface material. Specific example implementations of this capacitive structure include, among others, laser-diode devices for applications such as optical-electronics, IGFETs, DRAM storage capacitors, and discrete capacitors.

Other example embodiments of the present invention are directed to methods of manufacturing the above structures. One such embodiment involves passivating the Ge-rich surface material, for example, by removing unstable native oxides of Germanium and then depositing a high-k dielectric on the Ge-rich surface material. Another related embodiment involves converting Germanium oxide at the surface to a stable form. In the latter approach, unstable Germanium-based oxides are converted to a stable form by combining them with a high-k dielectric such that the resulting material is thermodynamically stable with Germanium and therefore can be used, for example, as an IGFET gate dielectric material.

In another example embodiment of the present invention, a semiconductor device includes an epitaxially-deposited dielectric layer including a high-k dielectric material at a surface that faces, lies against and is thermodynamically stable with a Ge-based surface material, such as those discussed above. In one implementation, the Ge-based surface material is treated, prior to deposition of the dielectric layer, to remove and/or chemically modify native $GeO_x$ (i.e., where x is a number less than or equal to 2). The surface treatment may include, for example, aqueous rinsing, high vacuum annealing or vapor etching with a material including hydrofluoric acid (HF). In one implementation, the dielectric layer has a thickness not greater than about 10 Angstroms $T_{Ox,Eq}$.

In still another example embodiment of the present invention, a semiconductor device is manufactured using an approach that includes cleaving a Germanium-on-insulator (GeOI) structure from a wafer. Hydrogen is implanted into a germanium-containing layer of a semiconductor device having the germanium-containing layer on an insulator layer, and the device is subsequently annealed to create voids in the germanium-containing layer. The voids are used in cleaving the germanium-containing layer, such that a portion of the germanium-containing layer on the insulator is cleaved from the device. In one implementation, the cleaved portion of the device is subsequently bonded with the insulator layer face-down on a bulk substrate.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which:

FIG. 1 is capacitive structure with upper and lower conductive layers on opposite sides of a stable, high-k dielectric layer, according to an example embodiment of the present invention;

FIGS. 2C and 2D show a semiconductor device with a high-k dielectric material being formed on a Ge-rich substrate material, according to another example embodiment of the present invention;

Figure 2A:
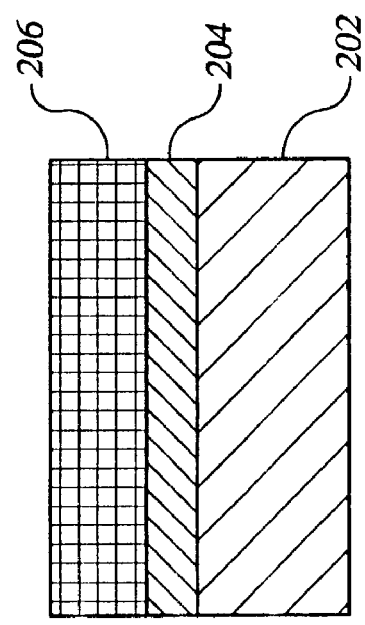
FIGS. 2A and 2B show a semiconductor device with a high-k dielectric material between a gate and a Ge-rich substrate material undergoing manufacture, according to another example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of circuit applications benefiting from ultra-thin high-k dielectric capacitive structures, and has been found to be particularly useful for semiconductor circuits employing Germanium-based substrate materials. While the present invention is not necessarily limited to such circuit types, various aspects of the invention may be appreciated through a discussion of various examples using this context.

According to an example embodiment of the present invention, a semiconductor circuit includes a capacitive structure having electrode layers surrounding a dielectric layer, such as a gate electrode and an IGFET channel that would surround a gate dielectric of a conventional MOSFET or MOSCAP. At an interface between one of the electrode layers and the dielectric layer, the dielectric layer includes a high-k dielectric surface material and the one electrode layer includes an electrode surface material that is thermodynamically stable with the high-k dielectric surface material. The dielectric layer has a thickness that is not greater than about 10 Angstroms $T_{Ox,Eq}$ (equivalent oxide thickness). In one implementation, the dielectric layer has a thickness and composition sufficient to passivate the electrode surface material (i.e., to cause the termination of bonds on the electrode surface material with elements assuring chemical stability of the surface). In another implementation, the electrode surface material is sufficiently Ge-rich (Germanium rich) so that the interface maintains thermodynamic stability. In still another implementation, the electrode surface material is a Silicon-rich material, and the process providing the interface is adequately precise to avoid unstable native oxides from interfering with the thermodynamic stability of the material at the interface.

The equivalent oxide thickness $T_{Ox,Eq}$ as referred to herein is directed to the thickness of an equivalent dielectric layer of $SiO_2$. In some instances, $T_{Ox,Eq}$ refers to the thickness of a dielectric scaled by the ratio of its dielectric constant to the dielectric constant of $SiO_2$, as denoted by the following equation:

$$T_{OxEq} = t_x \cdot \frac{\varepsilon_{ox}}{\varepsilon_x}, \text{ wherein:} \quad \text{(Equation 1)}$$

$t_x$ is the thickness of the dielectric layer;
$\varepsilon_{ox}$ is the dielectric constant of oxide; and
$\varepsilon_x$ is the dielectric constant of the dielectric layer.

Using Equation 1, a layer of dielectric material "x" having an equivalent oxide thickness $T_{Ox,Eq}$ of 10 Angstroms thus has a thickness ($t_x$) as follows:

$$t_x = T_{Ox,Eq} \cdot \frac{\varepsilon_x}{\varepsilon_{ox}}, \quad \text{(Equation 2)}$$

where $T_{Ox,Eq}$=10 Angstroms.

With the above approaches, stable electrical, electromechanical, optical and other devices employing high-k dielectric materials with electrodes can be realized. For instance, Germanium-based substrates sharing an interface with a dielectric material using such approaches have been discovered to exhibit thermodynamically stable behavior. These types of devices are readily employed in a variety of semiconductor applications, micro-electro-mechanical system (MEMS) applications and others.

For the sake of brevity, unless otherwise indicated, certain terms used in this patent document are intended to carry certain meanings. "Capacitive structure" refers to nonparasitic capacitance that is specifically designed into the circuit to provide, for example, a capacitance greater than about 32 fF/micron$^2$. "Thermodynamically stable" refers to an expected useful circuit life of at least several years, stability through fabrication (including, e.g., low temperature annealing), and to those structural interfaces that are stable because either the high-k dielectric surface material is kinetically inhibited relative to the Ge-rich surface material or the structures are thermodynamically stable as indicated in the context of a phase diagram. "Hi-k" (high permittivity) refers to a dielectric constant that is at least about 12 (i.e., above aluminum oxide). "Ge-rich" refers to a material having a composition of Germanium, the relative amount of Germanium being selected in connection with particular implementations. For instance, Germanium-containing materials having a composition of Germanium in ranges of between about 30%-60% Germanium, 50%-60% Germanium and 60% to 100% Germanium are employed in various implementations (i.e., depending upon available materials and desired device characteristics). Further, in view of the various applications and example embodiments to described below, it will be appreciated that the term "substrate material" is not necessarily limited to fundamental structures from which semiconductor materials are built.

In a more particular example embodiment of the present invention, the above-mentioned high-k dielectric surface material of the dielectric layer is preferably present throughout the dielectric layer to maintain the beneficial characteristics of the high-k dielectric while minimizing the $T_{Ox,Eq}$.

In one implementation, the present invention is directed to the manufacture of the above type of capacitive structure. FIG. 1 illustrates such a capacitive structure 100, according to an example embodiment of the present invention and with upper and lower electrode layers 104 and 102 on opposing sides of a dielectric layer 106. The dielectric layer 106 includes a high-k dielectric material and the lower electrode layer 102 has an upwardly-directed electrode surface material that is thermodynamically stable with the high-k dielectric material. The dielectric layer 106 has an electrical thickness that is not greater than about 10 Angstroms $T_{Ox,Eq}$ (equivalent oxide thickness). For example, using a Ge-rich material for layer 102, the dielectric layer can include one or more of a variety of high-k materials, such as Beryllium oxide, Cerium oxide, Dysprosium oxide, Erbium oxide, Gadolinium oxide, Hafnium oxide (e.g., $HfO_2$), Lanthanum oxide (e.g., $La_2O_3$), Thorium oxide, Titanium oxide (e.g., $TiO_2$), Uranium oxide, Yttrium oxide and Zirconium oxide (e.g., $ZrO_2$). The dielectric layer 106 may also include other transition metal oxides, oxides in the Lanthanide series and/or oxides in the Actinide series. Moreover, Ge-rich materials used for layer 102 may include, in addition to Germanium, substrate-type materials such as silicon, carbon, nitrogen and combinations thereof. Various ones of the above-mentioned materials and/or combinations thereof may be implemented to achieve particular results specific to selected applications. For example, depending upon size constraints, speed constraints, available material and other characteristics, combinations of materials are selected to achieve a variety of results.

The device 100 formed in connection with the above approaches has been discovered to exhibit properties including high carrier mobility and high permittivity in the dielectric layer 106, which makes the device 100 particularly useful in insulated gate semiconductor applications. One such insulated gate approach involves the lower electrode 102 being Ge-rich and implemented as a channel region that is readily switched between blocking and conducting states in response to a voltage applied to the upper electrode 104. Various implementations of the capacitive structure include those discussed in connection with the figures below.

In a more particular example embodiment, the lower electrode 102 includes Germanium and an interface layer 103. The interface layer may, for example, include Germanium, as with the remaining portion of the lower electrode 102, but stabilized such that it is stable (thermodynamically, chemically and/or otherwise) with the dielectric layer 106. For instance, metal Germanates, metal Oxides and other stabilized materials may be included with the interface layer 103.

Figure 2B:
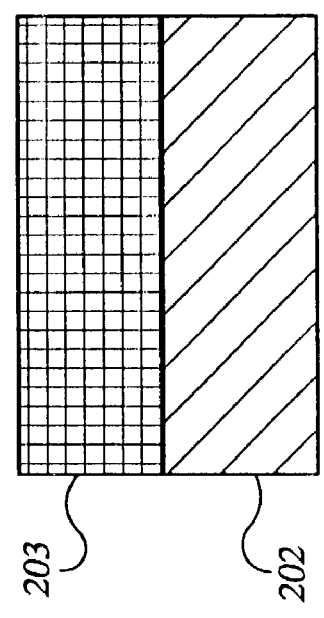
Figure 3B:
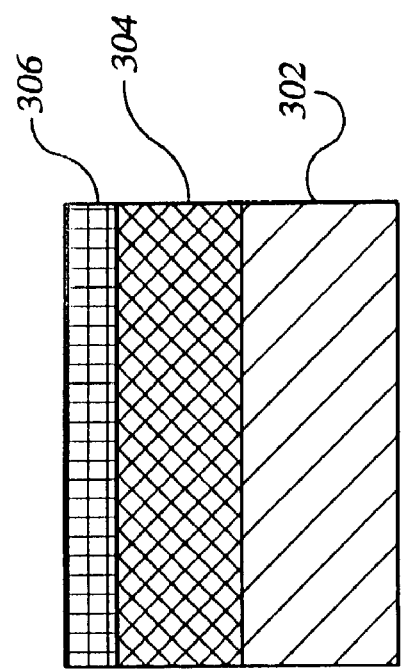
FIGS. 3A and 3B show a semiconductor device with a high-k dielectric material between a gate and a Ge-rich substrate material undergoing manufacture using metal oxides deposition on Germanium surface oxides, according to another example embodiment of the present invention.
Figure 3A:
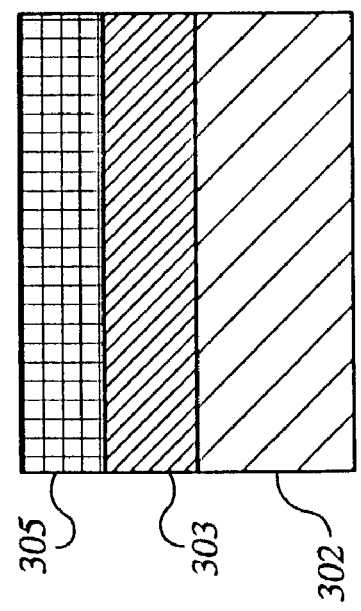
Figure 4B:
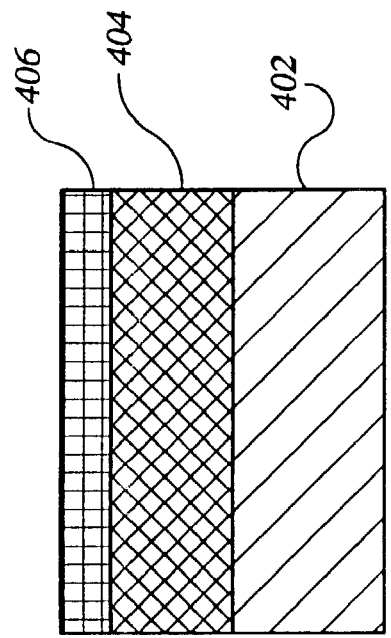
FIGS. 4A and 4B show a semiconductor device with a high-k dielectric material between a gate and a Ge-rich substrate material undergoing manufacture using metal deposition on Germanium surface oxides, according to another example embodiment of the present invention.

Also according to the present invention, FIGS. 2A-4B respectively show cross-sectional views of a capacitive structure being formed using a variety of approaches. As will be addressed in further detail below, each of these approaches is directed to mitigating potential problems due to the presence of unstable surface oxides forming on a Germanium-based substrate material. FIGS. 2A and 2B illustrate a semiconductor device being formed with a high-k dielectric material between a gate and a Germanium substrate material using a deposited layer of stable material. FIGS. 2C and 2D show a semiconductor device being formed with unstable surface oxides stripped off a Germanium substrate material and a metal layer deposited thereon. FIGS. 3A and 3B illustrate a semiconductor device being formed with a high-k dielectric material between a gate and a Germanium substrate material using metal oxide deposition on Germanium surface oxides. FIGS. 4A and 4B illustrate a semiconductor device being formed with a high-k dielectric material between a gate and a Germanium substrate material using metal deposition on Germanium surface oxides.

In a more particular implementation of the above-discussed example embodiments, a high-k dielectric material is combined with unstable Germanium-based oxides in the dielectric material (e.g., created during annealing of the device). This combination converts the unstable Germanium-based oxides ($GeO_y$) into a stable form, such that the resulting material is thermodynamically stable with the Germanium substrate material. Common surface Germanium oxides (e.g., GeO and $GeO_2$) on the Germanium substrate material are rinsed off and/or sublimed via their water solubility and/or volatility. With this approach, unstable Germanium oxides are transformed into a more stable phase (GeOy) and/or to a thermodynamically stable metal Germanate ($M_aGe_bO$). Also in connection with this approach, it has been discovered that a stack of metal oxide ($MO_x$) on the stable $GeO_y$ or $M_aGe_bO$ exhibits a much higher dielectric permittivity than stacks based on conventional materials, such as silicon dioxide for silicon MOS applications that typically exhibit a permittivity (k) of about 3.9. Thus, the converted dielectric material is readily implemented in a variety of applications, including implementation as a MOS gate dielectric material where silicon dioxide has traditionally been used.

FIGS. 2A and 2B show a Germanium-based semiconductor device 200 at different stages of manufacture, according to another example embodiment of the present invention. In FIG. 2A, unstable surface oxides on a Germanium substrate material 202 have been stripped off and a high-k layer 203 is deposited thereon. The stable layer 203 may include, for example, metal oxide, metal silicate, metal Germanate and/or other material that exhibits high permittivity while maintaining thermodynamic stability for an adequate lifetime of subsequent processing and use. In FIG. 2B, the device 200 is annealed and a portion of or the whole stable layer 203 may react to form a thin layer of different silicates and/or germanates 204, with a thicker portion 206 of the stable layer remaining unchanged. In one implementation, the stable layer 203 is completely reacted, with portions 204 and 206 forming one single layer. The thickness and composition of the thin layer 204 is such that the device 200 maintains the thermodynamic stability discussed above.

FIGS. 2C and 2D show a Germanium-based semiconductor device 250 at different stages of manufacture, according to another example embodiment of the present invention. In FIG. 2C, unstable surface oxides on a Germanium substrate material 252 have been stripped off and a metal layer 253 is deposited thereon. The device 250 is annealed and/or oxidized to form a stable high-k dielectric layer 254, as shown in FIG. 2D. Specifically, the metal layer 253 is being oxidized to form the high-k dielectric layer 254. In one implementation, the stable high-k dielectric layer 254 is comprised solely of metal oxide. In another implementation, the stable high-k dielectric layer 254 includes metal oxide, stable Germanium oxides and/or stable metal germanates. In each of these implementations, the resulting structure exhibits stable thermodynamic behavior, as discussed above.

FIGS. 3A and 3B show a Germanium-based semiconductor device 300 at different stages of manufacture, according to another example embodiment of the present invention. In FIG. 3A, a stable metal oxide layer 305 is deposited on an unstable Germanium oxide layer 303, which is in turn disposed on a Germanium substrate material 302. The metal oxide layer 305 may include, for example, oxides of metal, metal silicates and/or metal germanates. The device 300 is annealed and/or oxidized to form a stable high-k dielectric layer 304, leaving a remaining portion 306 of the stable metal oxide layer 305, as shown in FIG. 3B. In one implementation, the remaining portion 306 is consumed by the high-k dielectric layer 304. Specifically, a portion of the metal oxide layer 305 reacts with the unstable Germanium oxide layer 303 to replace and/or react unstable oxides and form the high-k dielectric layer 304. In one implementation, the unstable Germanium oxide layer 303 is reacted to form stable Germanium oxides. In another implementation, the unstable Germanium oxide layer 303 is reacted to form stable metal germanates. In each of these implementations, the resulting structure exhibits stable thermodynamic behavior, as discussed above.

Figure 4A:
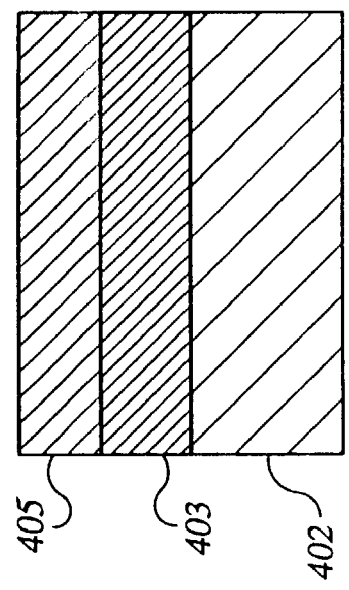

FIGS. 4A and 4B also show a Germanium-based semiconductor device 400 at different stages of manufacture, according to another example embodiment of the present invention. In FIG. 4A, a metal layer 405 is deposited on an unstable Germanium oxide layer 403, which is in turn disposed on a Germanium substrate material 402. The metal layer 405 may include, for example, metals that are susceptible to reactions that form metal oxides that exhibit a stable phase between the metal oxides and Germanium oxides, such as Zr, Hf and La. The device 400 is annealed and/or oxidized to form a stable high-k dielectric layer 404 and, in one implementation, an additional metal oxide layer 406 as shown in FIG. 4B. At least a portion of the metal layer 405 reacts with the unstable Germanium oxide layer 403 to replace and/or react unstable oxides and form the high-k dielectric layer 404 and a metal oxide layer 406 (e.g., a portion of the metal layer 405 that does not react with the unstable Germanium oxide layer 403 is oxidized to form layer 406). In one implementation, the unstable Germanium oxide layer 403 is reacted to form stable Germanium oxides. In another implementation, the unstable Germanium oxide layer 403 is reacted to form stable metal germanates. In another implementation, the unstable Germanium oxide layer decomposes in whole or in part during reaction with metal layer 405 (with or without external oxidation) to form a high-k metal oxide layer 404 that is substantially free of Germanium or Silicon. In each of these implementations, the resulting structure exhibits stable thermodynamic behavior, as discussed above.

The above example embodiments may be implemented in a variety of additional manners. For instance, a Germanium substrate material (e.g., substrates 102, 202, 252, 302 and 402) may include a pure Germanium wafer or a deposited Germanium film layer on a conventional silicon wafer (e.g., using physical vapor deposition, chemical vapor deposition, atomic layer deposition and/or epitaxy). Metal and metal oxide layers (e.g., layers 104, 203, 253, 305 and 405) may be deposited using one or more of many commonly-available methods, such as sputtering, evaporation and/or chemical vapor deposition. The unstable surface Germanium oxide layers (e.g., 303, 403) may include one or more of native, deposited, chemically formed, and/or thermally grown Germanium oxides. Oxidation may be carried out inside any suitable equipment, such as an oxidation furnace, rapid thermal annealer, ultra-violet oxidation chamber and/or a hot pot, with oxidizing ambient environments such as dry/wet oxygen, water, steam, peroxide solutions and/or ozone environments. Annealing may be performed inside one or more of a variety of types of annealing environments, such as in an annealing furnace or rapid thermal annealer, with ambient environments such as a forming gas, inert gases or oxygen.

In other example embodiments, Germanium substrate material (and/or Ge-rich surface material) as discussed in connection with various example embodiments herein includes Germanium substrate material that has been processed. In one instance, Germanium substrate material is processed to remove native oxides and/or other impurities therein. For example, removing native oxides may include combining Germanium-based oxides with a high-permittivity dielectric to produce a combination that is thermodynamically stable with Germanium. In another instance, Germanium substrate material is processed to convert it to a form that is stable with a high-k dielectric surface material that it lies against. For example, Germanium-based surface material that is to lie against the high-k dielectric material can be decomposed by reacting the Germanium-based surface material to form a high-k metal oxide layer that is substantially free of Germanium and/or Silicon. Such decomposition may involve, for example, external oxidation of the Germanium-based surface material. In still another instance, the Germanium substrate is passivated to render it unreactive or nearly unreactive with one or more types of material.

A variety of other modifications and/or additions can be applied in connection with the example embodiments discussed above. Referring to FIG. 1 as an example, the stable dielectric layer 106 may include a stable phase of Germanium oxide, or may be formed by converting unstable Germanium oxide material into stable Germanium nitrides and/or oxynitrides ($GeO_xN_y$). With these approaches, metals and/or metal oxides can be deposited directly on the high-k dielectric layer 106 to form layer 104.

Various other approaches can be used to form the stable dielectric and overlying conductive layers discussed above. In one implementation, and referring again to FIG. 1 as an example, layers 106 and 104 are formed via co-deposition (e.g. sputtering or CVD) of different metals and/or metal oxides, as well as Germanium and/or Germanium oxides, respectively. In another implementation, the layer 106 includes directly deposited metal Germanate. In another implementation, layer 104 is formed by depositing metal oxide and introducing dopants thereto. In connection with still another implementation, it has been discovered that metal (e.g., Zirconium (Zr)) can be sputtered directly on a Germanium wafer (102), followed by ultraviolet (UV) ozone oxidation to form layer 106. A top electrode layer 104 is then formed on the UV ozone oxidized layer 106, and the capacitive structure 100 is subsequently annealed.

In another implementation, using FIG. 3 as an example, a high-k dielectric material, such as Zirconium oxide ($ZrO_2$) or Hafnium oxide ($HfO_2$), is deposited on a surface Germanium oxide layer (e.g., between layers 303 and 305) via atomic-layer deposition (ALD). An upper electrode layer 306 is then deposited on the high-k dielectric material, followed by an annealing process.

Figure 5B:
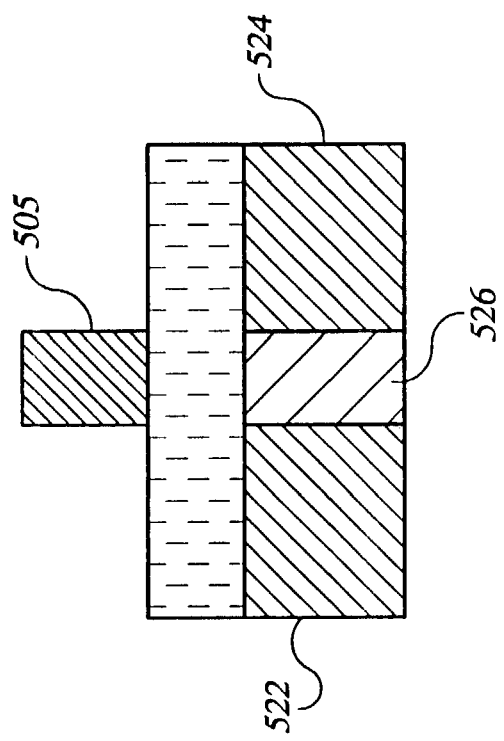
FIGS. 5A and 5B show a semiconductor device with a high-k dielectric material between a gate and a Ge-rich substrate material undergoing ion implantation self-aligned to the gate, according to another example embodiment of the present invention.
Figure 5A:
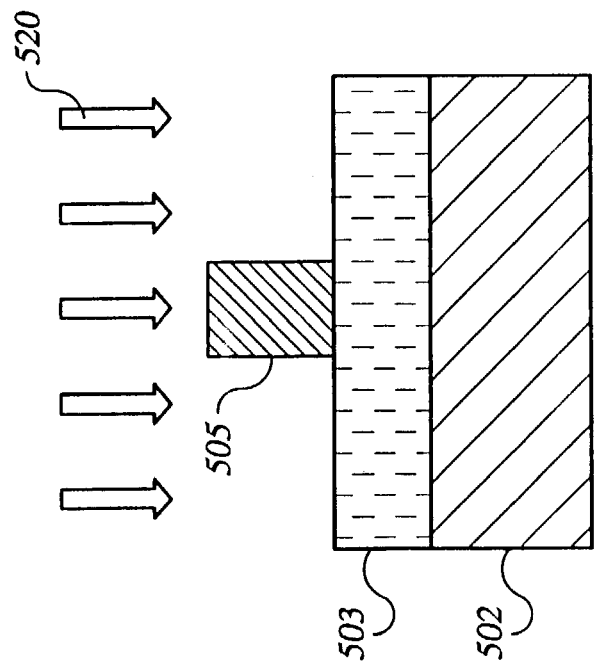

FIGS. 5A and 5B show an insulated gate field effect transistor (IGFET) at different stages of manufacture, according to another example embodiment of the present invention. In FIG. 5A, a Germanium substrate material 502 and a stable dielectric layer 503 are formed in a manner not inconsistent with one or more of the example embodiments discussed above. A gate electrode 505 is patterned from an electrode layer (e.g., by patterning layer 104 of FIG. 1). Dopant ions 520 are directed toward the substrate material 502. As shown in FIG. 5B, the ions 520 implant source/drain regions 522 and 524 that are self-aligned to the gate electrode 505, with a channel region 526 of the substrate material 502 being masked by the gate electrode 505. In response to a voltage applied to the gate 505, a signal is capacitively coupled across the stable dielectric layer 522 to bias the channel region 526 and electrically link source/drain regions 522 and 524.

Figure 6:
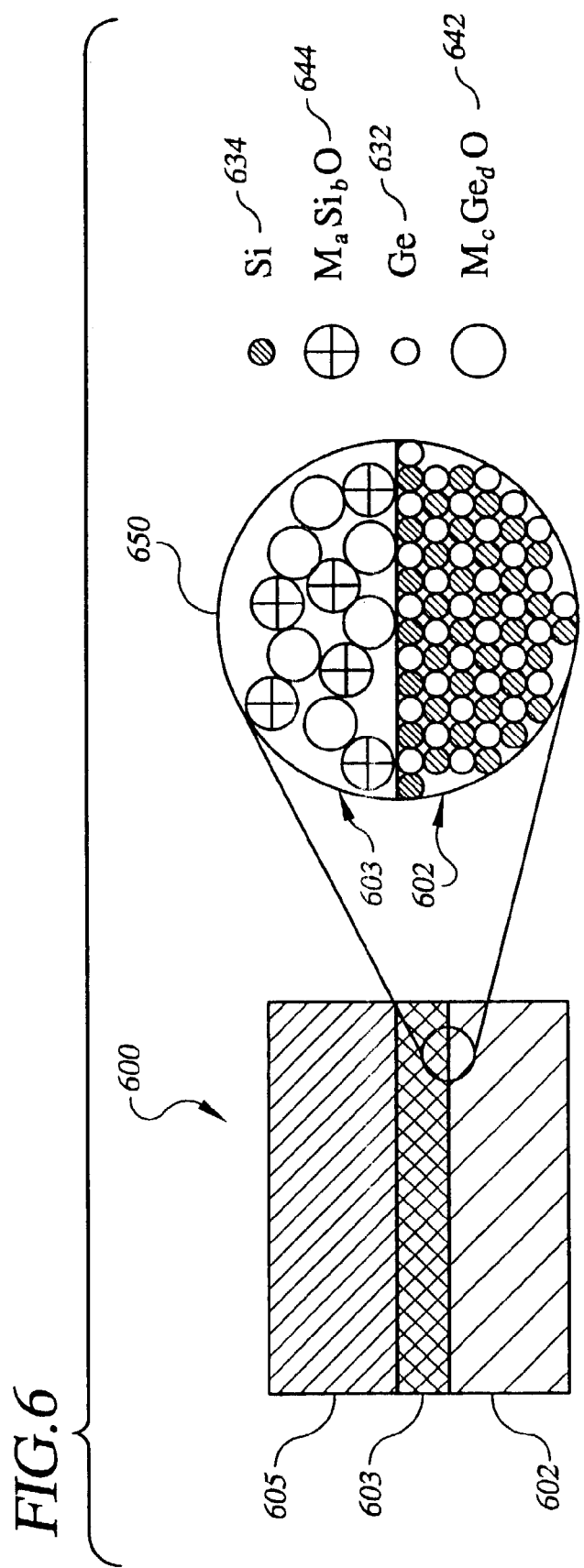
FIG. 6 is a semiconductor device with a high-k dielectric material, including metal silicates and germanates, between a gate and a Ge-rich material, according to another example embodiment of the present invention.

FIG. 6 shows a capacitive structure 600 having a stable dielectric layer 603 on a Germanium-containing substrate material 602 with metal silicates and metal germanates thereupon, according to another example embodiment of the present invention. The dielectric layer 603 may, for example, be implemented in connection with one or more of the example embodiments discussed herein. The stable combination of metal silicates and metal germanates is shown in the inset 650, with layer 603 comprising metal germanates and metal silicates 642 and 644, respectively, and with layer 602 comprising Germanium and Silicon atoms 632 and 634, respectively. The metal silicates 644 and metal germanates 642 have a mole fraction of about 50% each, without loss of generality. The dielectric layer 603 may include amorphous, polycrystalline and/or crystalline structures (e.g., with substantially no grain boundaries in the dielectric layer 603).

Each of the following examples discussed in connection with FIGS. 7-15 may be implemented using one or more of the various approaches discussed above, as well as variations thereof. In particular, the high-k dielectric materials are formed in a manner that facilitates thermodynamic stability with the Ge-based substrates used therein, and exhibits benefits including high carrier mobility, thermodynamic stability and others as discussed above.

Figure 7:
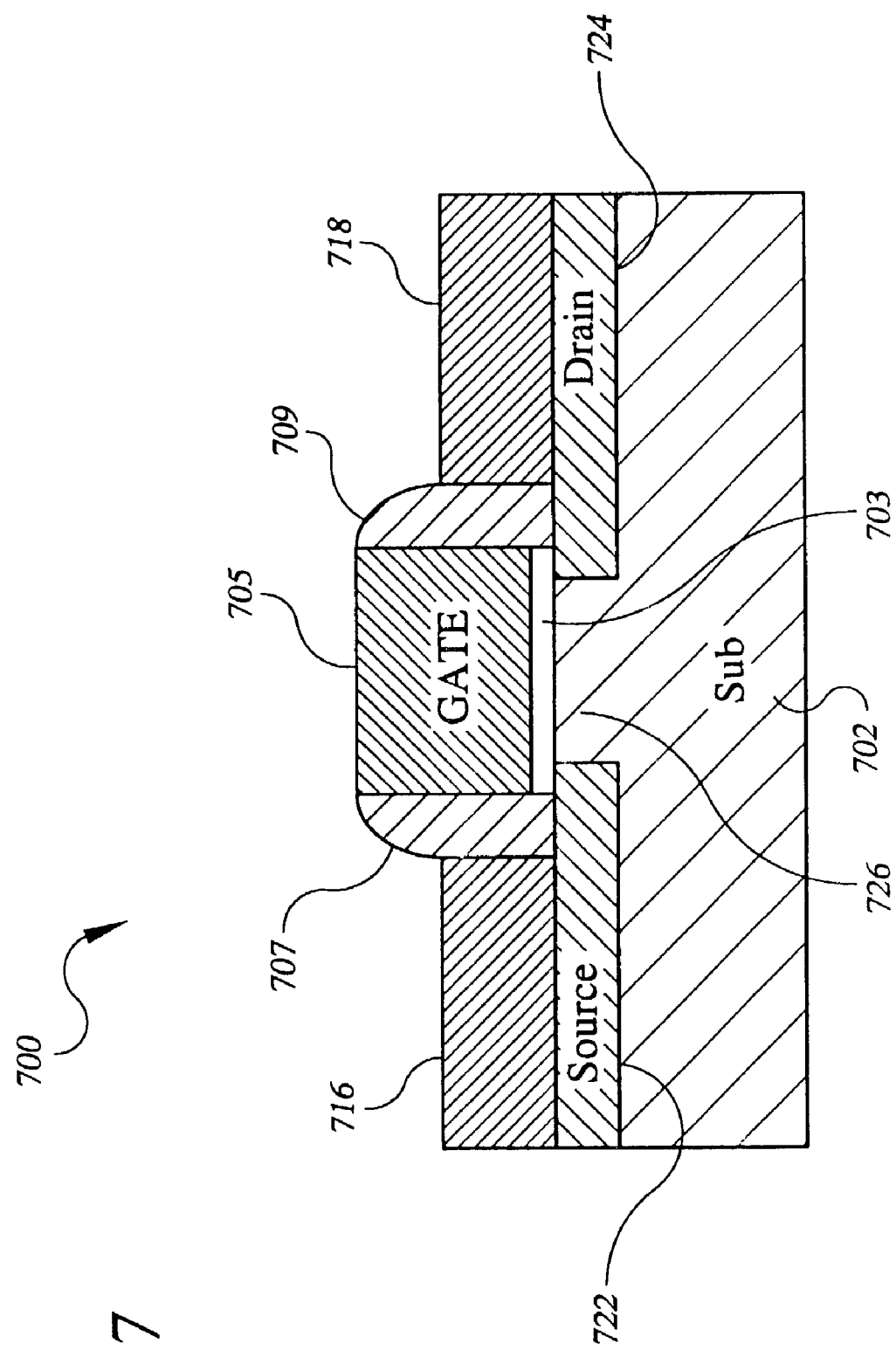
FIG. 7 is a MOS device with a high-k dielectric material between a gate and a Ge-rich substrate material, according to another example embodiment of the present invention.

In FIG. 7, an IGFET-type device 700 includes a stable gate dielectric layer 703 on a Ge-based substrate material 702, according to another example embodiment of the present invention. The device 700 includes a gate 705 separated from and adapted to capacitively couple to a channel region 726 in the Germanium substrate material 702 via the stable gate dielectric layer 703. Source/drain regions 722 and 724 are disposed on opposing sides of the channel 726 and in the substrate material 702, with elevated source/drain junctions 716 and 718 over each of source drain regions 722 and 724, respectively. As shown, region 722 is labeled as "source" and region 724 as "drain"; however, these regions are used interchangeably as source and/or drain regions, depending upon the implementation. Elevated source/drain junctions 716 and 718 are separated from the gate electrode 705 by spacers 707 and 709, respectively, and reduce the resistance of electrical contacts made to each of source/drain regions 722 and 724, respectively. By using the stable dielectric layer 703 over the Germanium channel 726, benefits including high carrier mobility in the channel region 726 with a highly stable dielectric layer 703 are realized.

The gate 705, gate dielectric layer 703 and channel region 726 are arranged such that a voltage applied to the gate 705 couples a signal to the channel region 726 via the gate dielectric layer 703. Current flow between the source/drain regions 722 and 724 is controlled using the signal coupled to the channel region 726, with a portion of the channel region 726 conducting the current.

Figure 8:
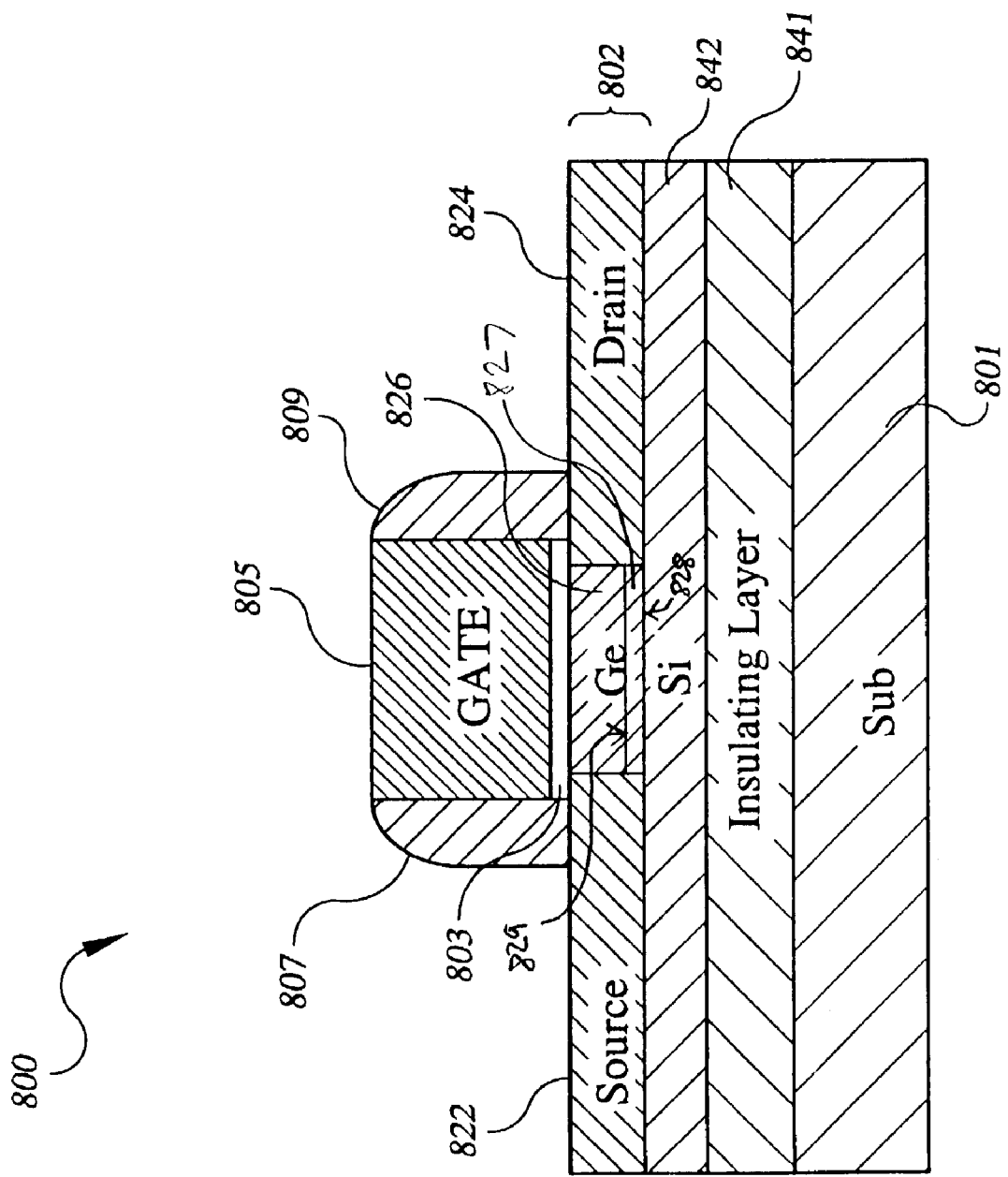
FIG. 8 is a Germanium-on-insulator (GeOI) MOSFET device with a high-k dielectric material between a gate and a Germanium substrate material, according to another example embodiment of the present invention.

FIG. 8 shows an IGFET with an active layer including a Germanium substrate material region 802 over an insulating layer 841 that form a Germanium-on-insulator (GeOI) structure, according to another example embodiment of the present invention. The insulating layer 841 (e.g., oxide) is disposed on a typical semiconductor substrate 801 (e.g., bulk silicon). A thin layer of silicon 842 separates the Germanium substrate material region 802 from the insulating layer 841. A Germanium channel region 826 is disposed in the Germanium substrate material region 802 between doped source and drain regions 822 and 824. A stable dielectric material 803 is formed on the channel region 826 and separates the channel region from a gate electrode 805 having insulative spacers 807 and 809 on opposing sides thereof.

In one particular implementation, a graded region 827 of channel region 826 has a graded composition including a Silicon-Germanium alloy. The composition of a lower portion of the graded region 827 at an interface 828 with the Silicon layer 842 is predominantly Silicon. An upper portion of the graded region 827 at an interface 829 with the remaining portion of the channel region 826 is Ge-rich (i.e., predominantly Ge or pure Ge).

In another particular implementation, the graded region 827 is formed sufficiently thick such that misfit dislocations are formed therein to partially relax elastic strains in the channel region 826. For instance, where crystalline lattice structures of materials in the graded region are misfitting, a dislocation of a portion of the lattice can occur (called a misfit dislocation), which partially relaxes elastic strains in the graded region. In the case where a Silicon-Germanium alloy lattice and a silicon crystalline lattice exist together, a lattice mismatch typically exists between the two, particularly as the content of Germanium in the Silicon-Germanium alloy increases (e.g., Ge-rich). The lattice mismatch causes distortion, which results in formation of a misfit dislocation. The thickness of the Silicon-Germanium layer affects the tendency for formation of the misfit dislocations, such that the higher the Germanium content, the smaller the thickness of the layer must be for forming such misfit dislocations. For instance, with a Silicon-Germanium layer having a Germanium content of about 40%, typically exhibits misfit dislocations when formed at a thickness of about 200-300 Angstroms or more on a silicon layer. In this regard, the thickness of the graded region 827 is selected as a function of the composition of Germanium therein. This approach has been found useful, for example, in preventing film roughening and/or defect formation that can occur when Ge or a Ge-rich SiGe alloy is deposited directly the Silicon layer 842. For general information regarding Germanium-containing layers, and for specific information regarding the selection of Silicon-Germanium layer thickness in connection with these and other example embodiments of the present invention, reference may be made to R. People et al., Applied Physics Letters, vol. 47, page 322, (1985), which is fully incorporated herein by reference.

Figure 9:
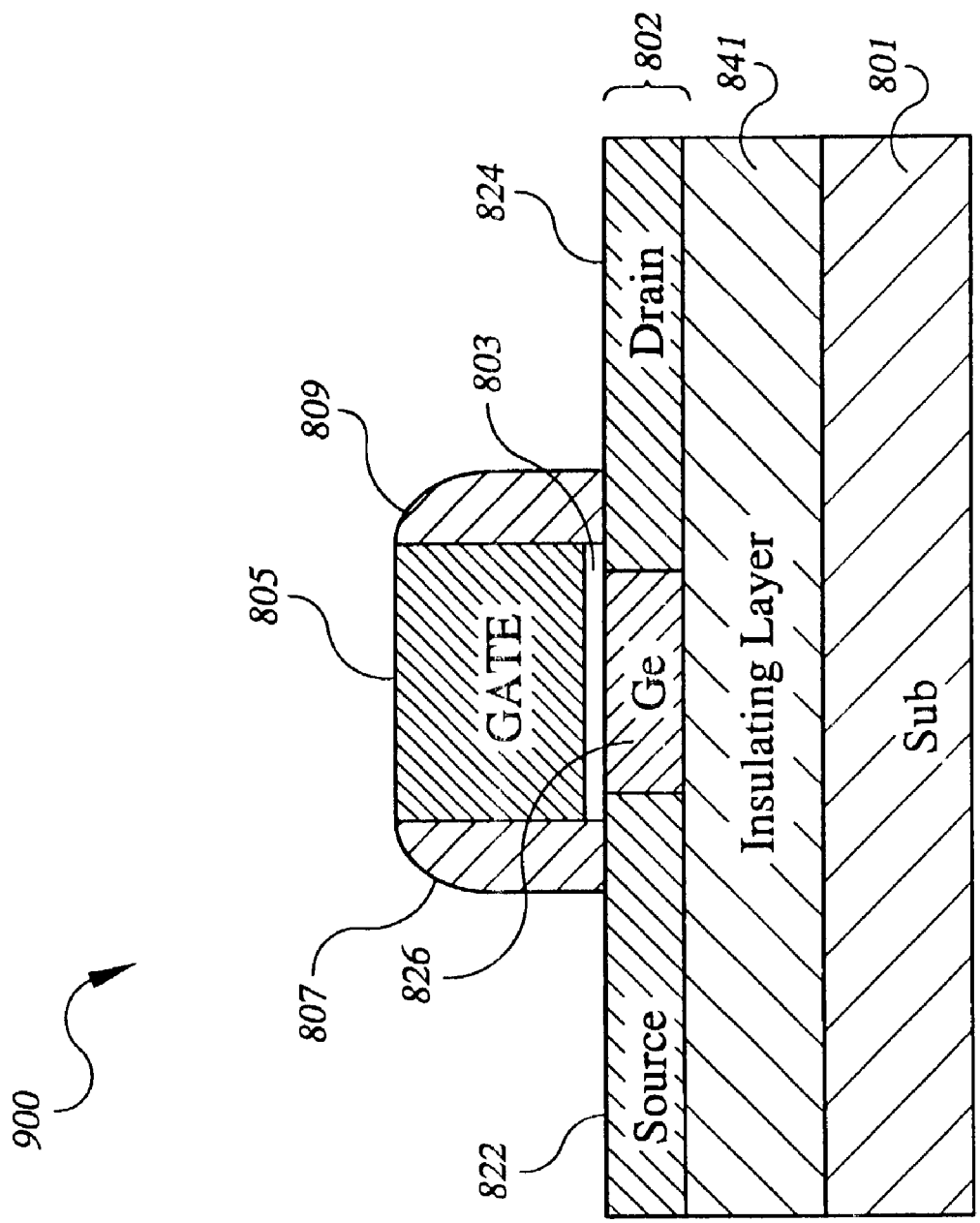
FIG. 9 is a Germanium-based thin-film transistor (TFT) device with a high-k dielectric material between a gate and a Germanium substrate material, according to another example embodiment of the present invention.

FIG. 9 shows another semiconductor device 900, similar to the device shown in FIG. 8 but without the silicon layer 842, according to another example embodiment of the present invention. For brevity, articles in FIG. 9 that are similar to those in FIG. 8 are similarly labeled. In this implementation, the Germanium layer 802 is formed directly on the insulating layer 841, with the resulting structure forming a Germanium-based thin film transistor (TFT).

Figure 10:
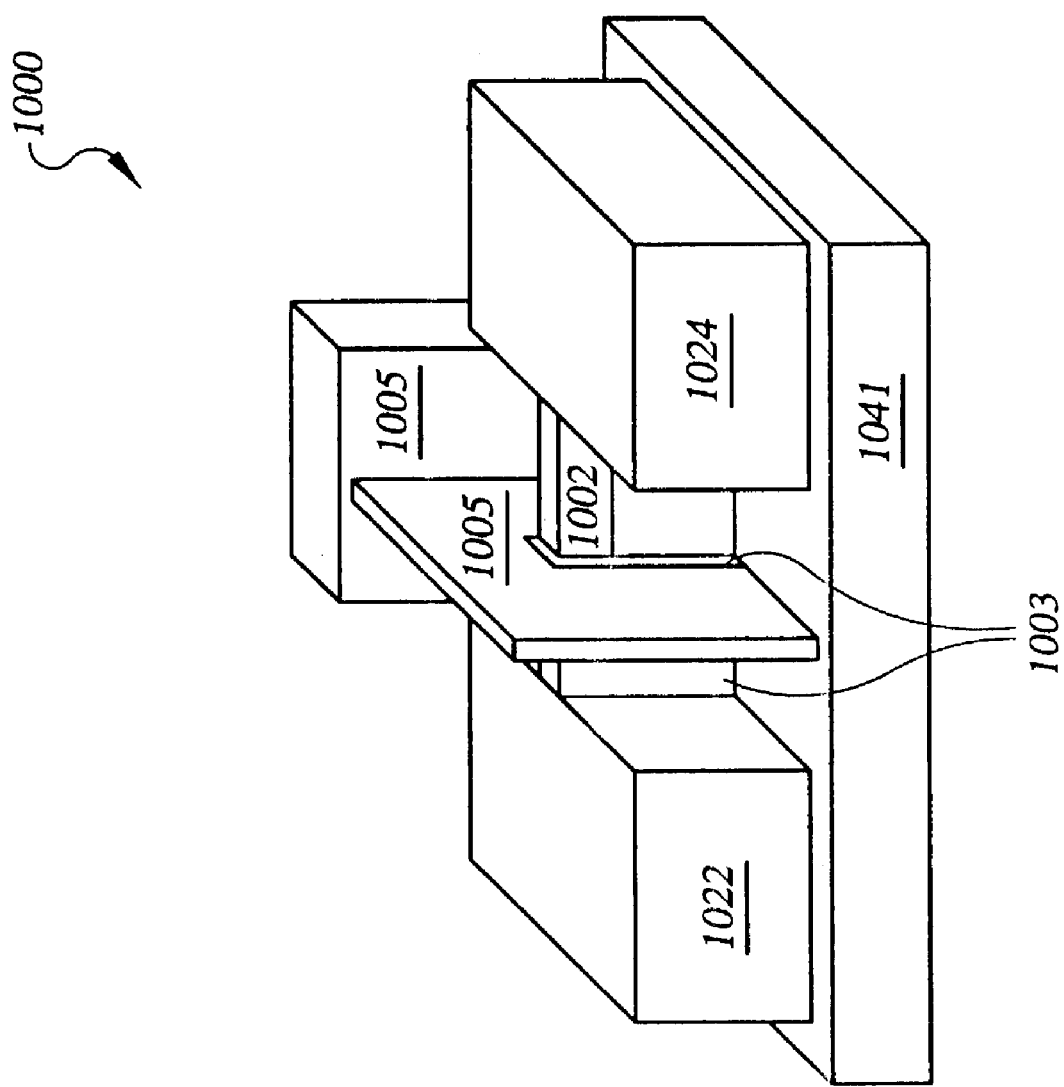
FIG. 10 is a Germanium-based transistor device with a thin channel region in a FinFET structure and having a high-k dielectric material between a gate and a Ge-rich substrate material, according to another example embodiment of the present invention.

FIG. 10 shows a FinFET device 1000 employing a Germanium-based channel region 1002 separated from a gate 1005 by a stable dielectric layer 1003, according to another example embodiment of the present invention. The FinFET is formed on an insulating layer 1041, with source and drain regions 1022 and 1024 being separated by the Germanium-based channel region 1002 having a ridge, or fin-type shape. The Germanium-based ridge (channel region) 1002 and the insulating layer 1041 form a Germanium ridge-on-insulator structure. The channel region 1002 extends over the insulator with the dielectric layer 1003 and gate 1005 facing the channel region 1002 on at least two sides thereof.

Figure 11:
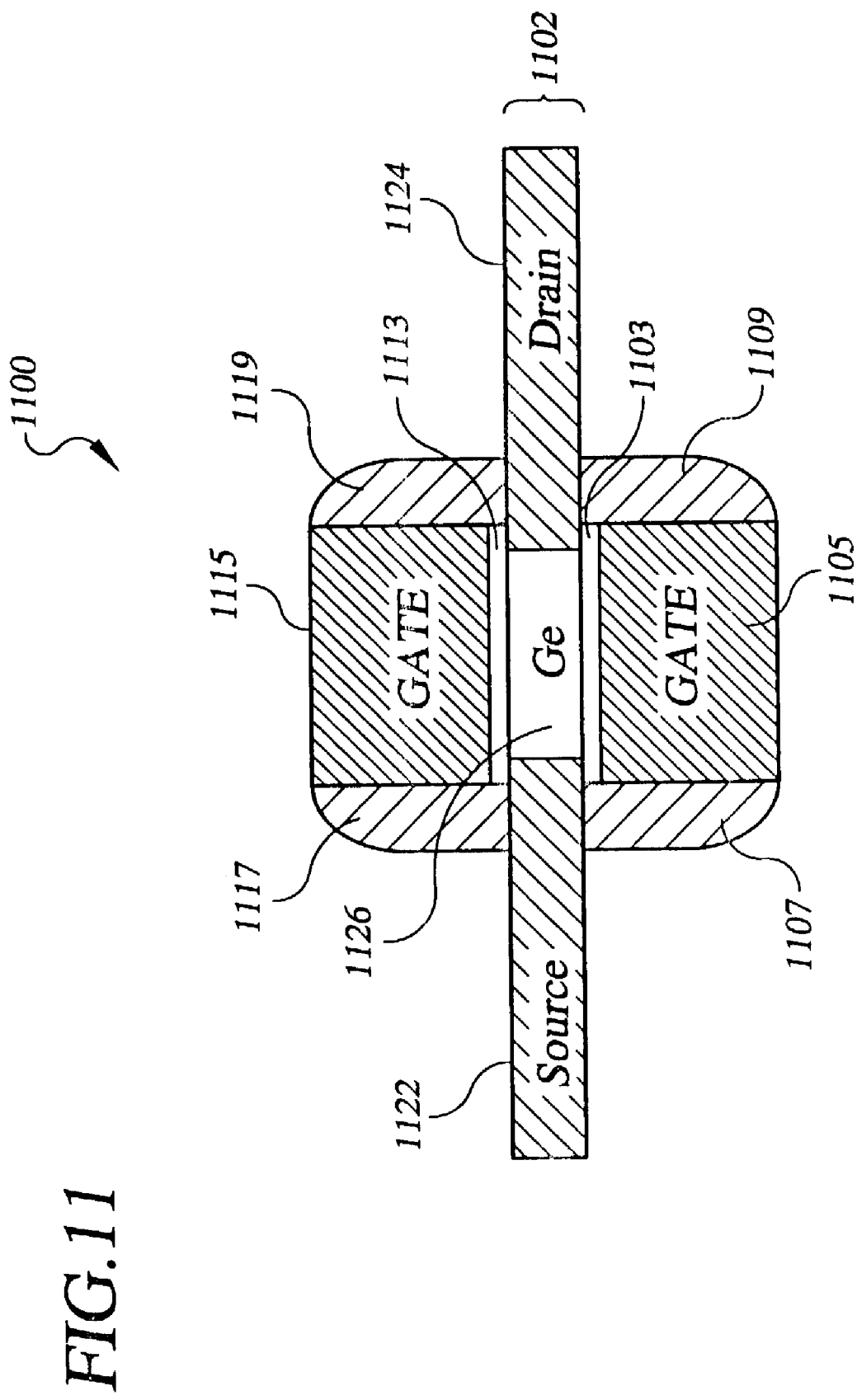
FIG. 11 is a Germanium-based double-gate MOSFET device with a high-k dielectric material between a gate and a Ge-rich substrate material, according to another example embodiment of the present invention.

FIG. 11 shows a double-gate MOSFET device 1100 employing a Germanium-based substrate material region 1102, according to another example embodiment of the present invention. A Germanium-based channel region 1126 is separated from dual gate electrodes 1105 and 1115 by a selected high-k dielectric material 1103 and 1113. The Germanium-based channel region 1126 separates source and drain regions 1122 and 1124 in the substrate material region 1103. Insulative spacers 1107 and 1109 are disposed on opposing sides of gate electrode 1105, with insulative spacers 1117 and 1119 similarly disposed on opposing sides of gate electrode 1115.

Figure 12:
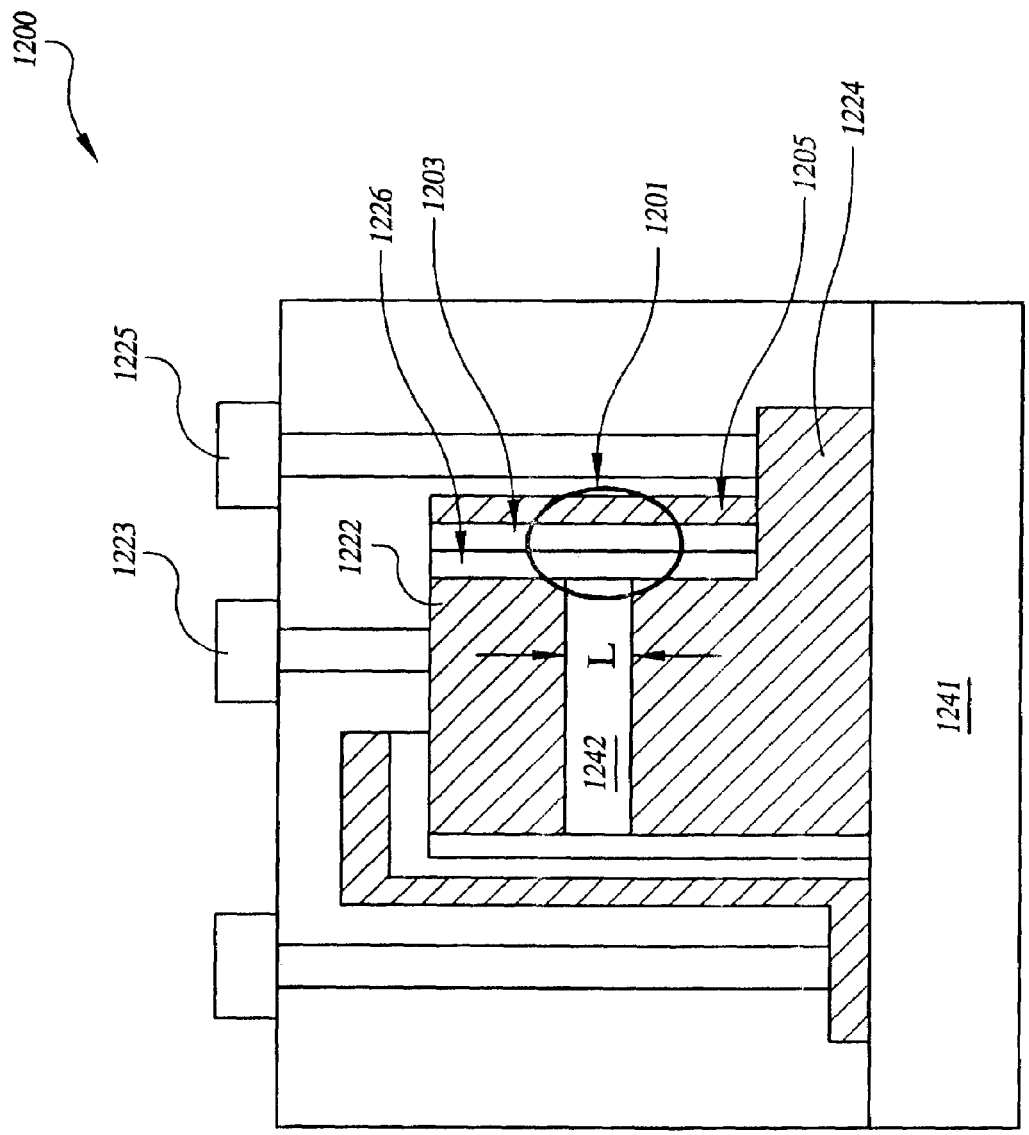
FIG. 12 is a Germanium-based vertical transistor device with a high-k dielectric material between a gate and a Ge-rich substrate material, according to another example embodiment of the present invention.

FIG. 12 shows a vertical transistor device 1200 employing at least one Germanium-based channel region separated from a gate electrode by a selected high-k dielectric material, according to another example embodiment of the present invention. Source region 1222, having contact 1223, and drain region 1224, having contact 1225 are separated by a silicon oxide region 1242 with the drain region 1224 being disposed on a silicon oxide layer 1241. A transistor 1201 includes a channel region 1226 separated from a gate electrode 1205 by a dielectric layer 1203. The channel region and dielectric materials for the transistor include germanium and a stable dielectric material, respectively, as discussed in other example embodiments above. For general information regarding transistor implementations, and for specific information regarding vertical transistor applications that can be benefited by the present invention, reference may be made to Kalavade & Saraswat, IEEE DRC 2000, which is fully incorporated herein by reference.

Figure 13:
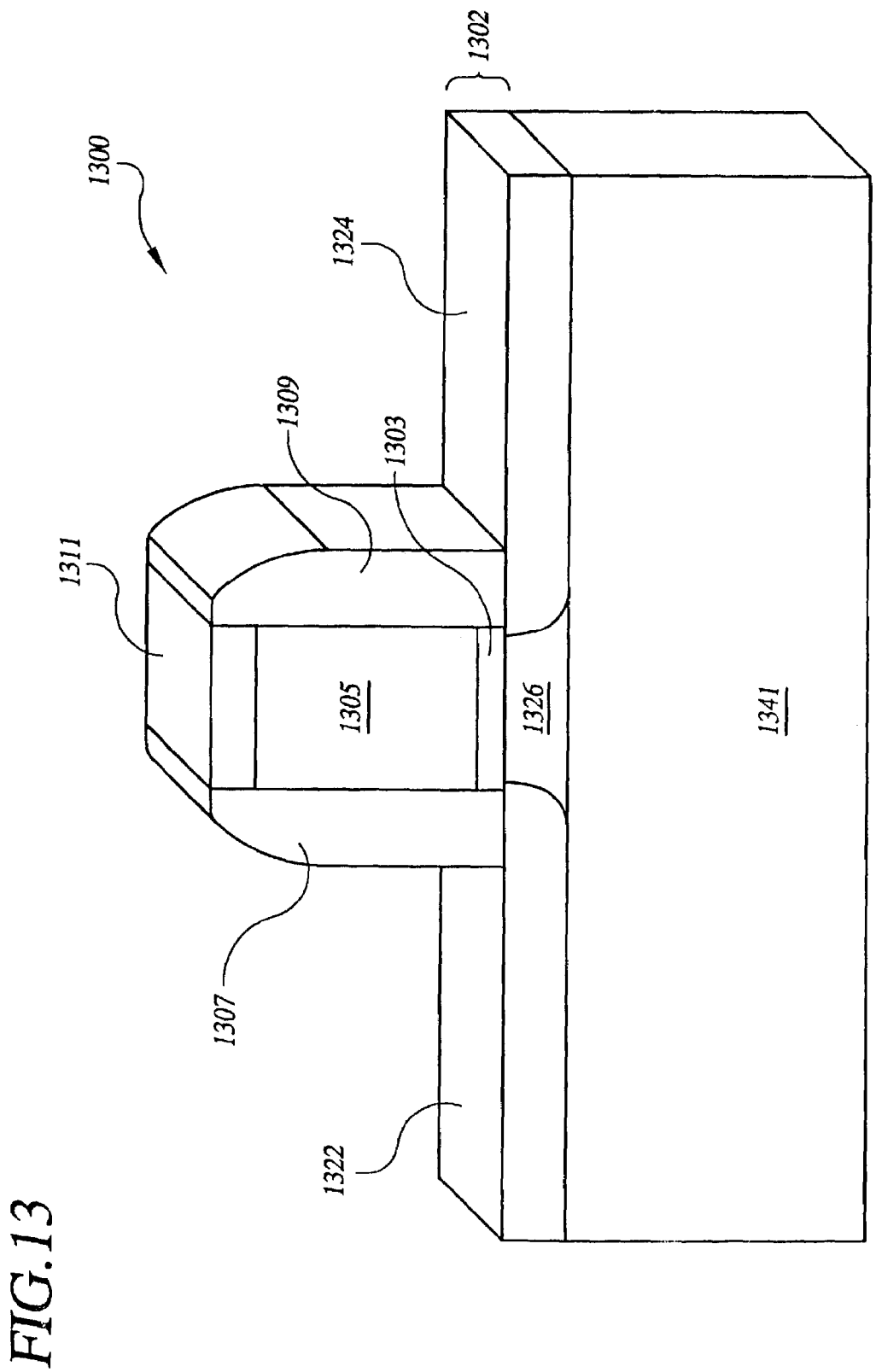
FIG. 13 is a Germanium-based Schottky MOSFET device with a high-k dielectric material between a gate and a Ge-rich substrate material, according to another example embodiment of the present invention.

FIG. 13 shows a Schottky source/drain MOSFET device 1300 having a Germanium-based substrate material region 1302 disposed on an insulating layer 1341, according to another example embodiment of the present invention. The Germanium-based substrate material region 1302 includes a Germanium-based channel region 1326 that separates source and drain regions 1322 and 1324, respectively. A stable dielectric material 1303 separates the Germanium-based channel region 1326 from a gate electrode 1305 having a conductive contact material 1311 formed thereon and insulative sidewall spacers 1307 and 1309 on opposite sides thereof.

Figure 14A:
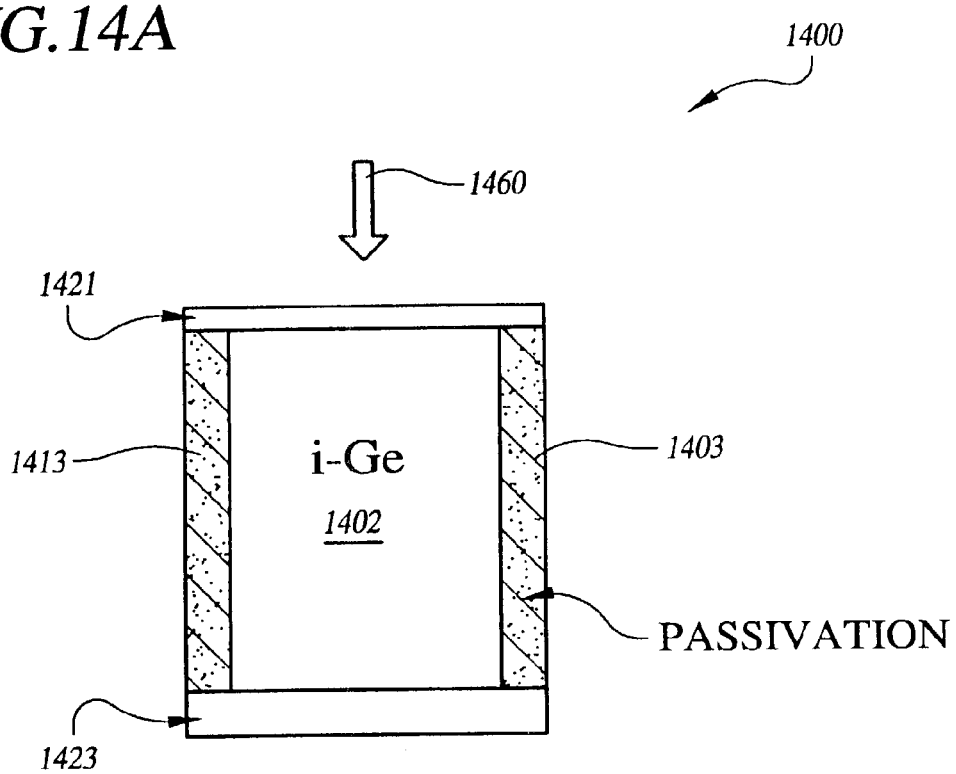
FIG. 14A is a Germanium-based metal-semiconductor-metal (MSM) photodetector with a high-k dielectric material on opposing sides of a Ge-rich substrate material, according to another example embodiment of the present invention.

FIG. 14A is a Germanium-based metal-semiconductor-metal (MSM)-type photodetector 1400, according to another example embodiment of the present invention. The MSM-type structure includes an intrinsic Germanium substrate material region 1402 disposed between upper and lower conductive contacts 1421 and 1423. High-k passivation layers 1413 and 1403 are disposed on opposing sides of the intrinsic Germanium region 1402. Light 1460 incident upon the photodetector 1400 is absorbed in the intrinsic Germanium substrate material region 1402 and causes electron-hole pair generation, which in turn results in current flow in the MSM photodetector 1400 between the upper and lower electrodes 1421 and 1423. The current flow in the MSM photodetector 1400 can be used to detect the incident light, as well as characteristics thereof.

Figure 14B:
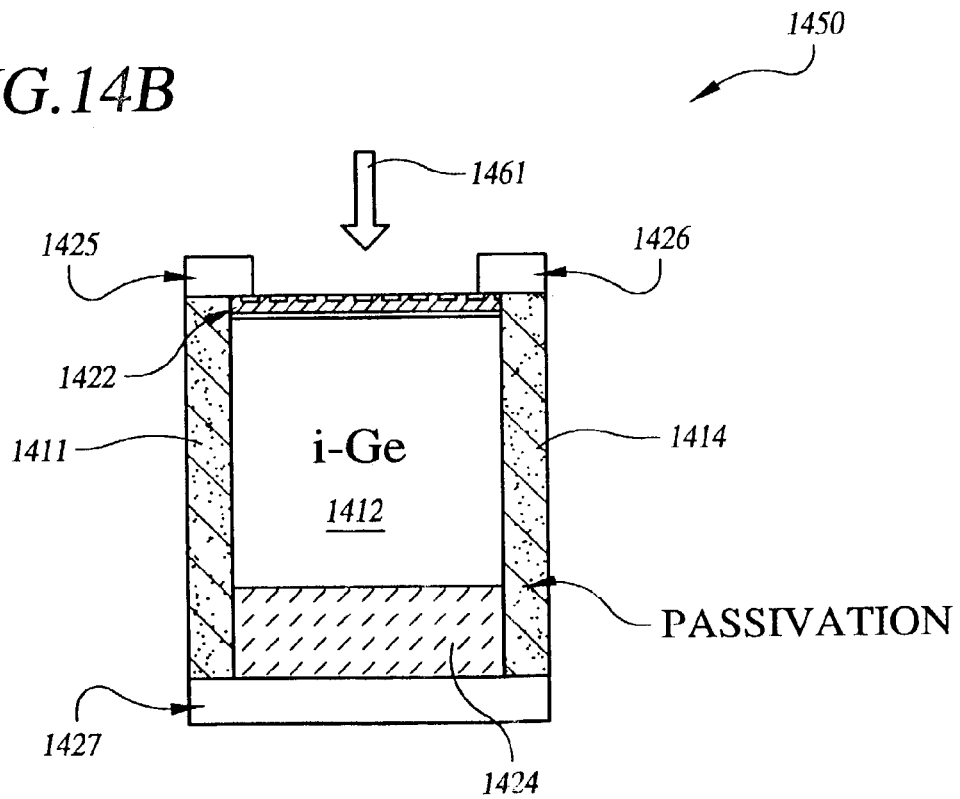
FIG. 14B is a Germanium-based PIN photodiode with a high-k dielectric material on opposing sides of a Ge-rich substrate material, according to another example embodiment of the present invention.

FIG. 14B is a Germanium-based p+ doped/intrinsic/n+ doped (PIN) photodiode 1450, according to another example embodiment of the present invention. The PIN photodiode 1450 includes an intrinsic Ge-rich substrate material region 1412 disposed between an n-doped Germanium region 1422 and a p-doped Germanium region 1424. In another example implementation, 1422 is a p-type region and 1424 is an n-type region. High-k passivation layers 1411 and 1414 are disposed on opposing sides of the intrinsic Germanium substrate material region 1412, with conductive contact regions 1425 and 1426 being electrically coupled to the n-doped Germanium region 1422 and conductive contact region 1427 being coupled to the p-doped Germanium region 1424. Light 1461 incident upon the photodetector 1450 is absorbed in the intrinsic Ge-rich substrate material region 1412 and causes electron-hole pair generation, which in turn affects current flow in the PIN photodiode 1450 between the conductive contact regions 1425 and 1426 and the conductive contact region 1427. As with the MSM photodetector 1400, the current flow in the PIN photodiode 1450 can be used to detect the incident light, as well as characteristics thereof.

With the approaches described above in connection with both FIGS. 14A and 14B, dark current (e.g., current flow in the absence of the light illumination 1460 or 1461) is relatively low, such that a current signal from the MSM photodetector 1400 or the PIN photodiode 1450 includes relatively low noise. When the light illumination 1460 and/or 1461 is applied to the devices, the resulting current signal representing the detected light has a very high signal-to-noise ratio. These devices 1400 and 1450 are particularly useful for use in a highly dense array of such devices for detecting infrared (IR) light, due to the ability of the intrinsic Germanium-based substrate materials 1402 and 1412 to readily absorb the IR light. Moreover, such high-k passivation layers can be implemented as discussed above, for example, in connection with FIGS. 2C and 2D.

Figure 15:
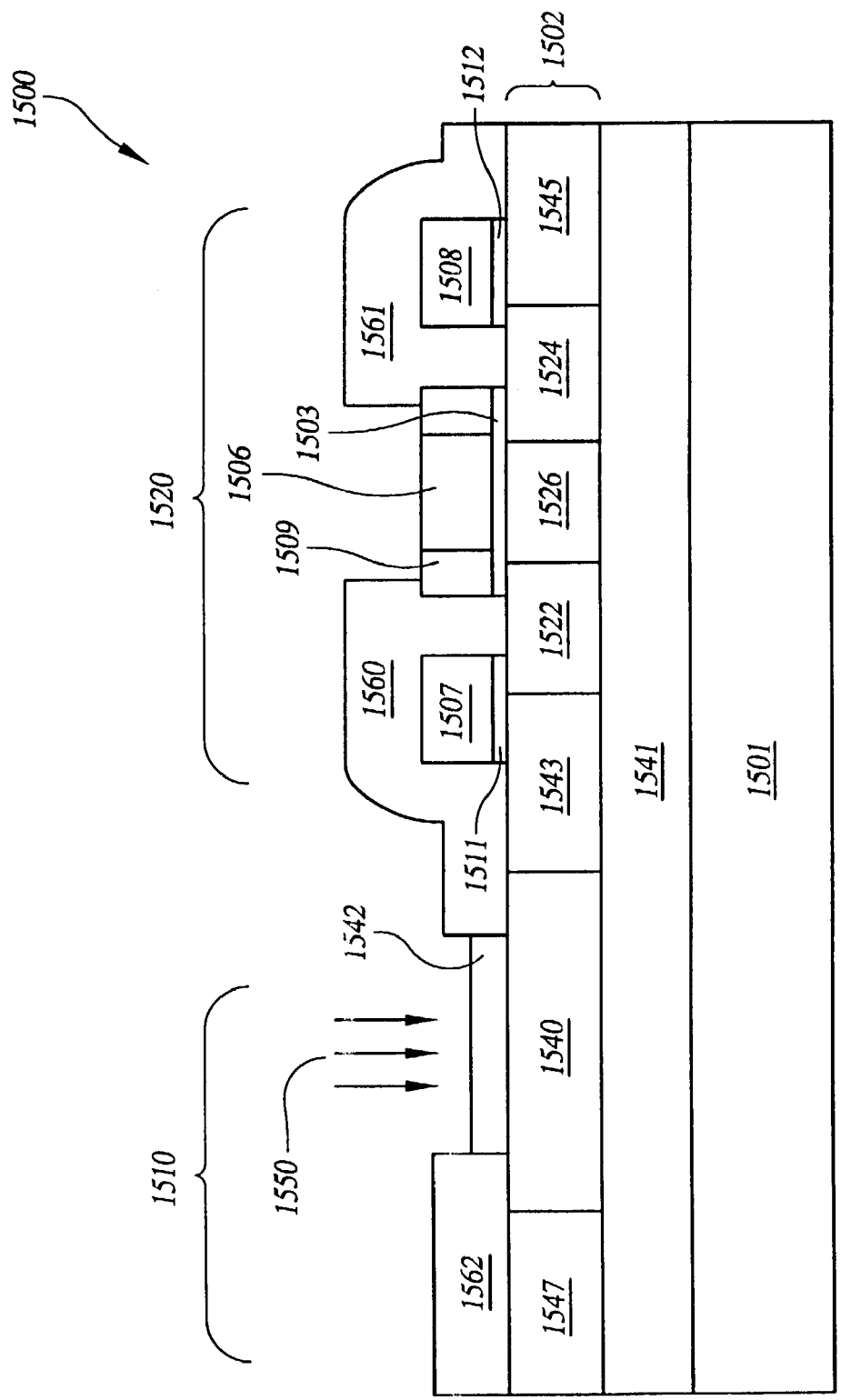
FIG. 15 is a Germanium-based optical receiver with a high-k dielectric material between a gate and a Ge-rich substrate material for a TFT and on top of an MSM, according to another example embodiment of the present invention.

FIG. 15 shows a Germanium-based monolithically integrated optical receiver 1500, according to another example embodiment of the present invention. The optical receiver 1500 includes a Germanium-based photodetector 1510 and a Germanium-based TFT 1520, similar to the devices shown in FIGS. 9 and 14A, respectively. The device 1500 includes a Silicon substrate 1501 with an inter-layer dielectric (ILD) layer 1541 having a high-k dielectric material disposed thereon. An amorphous Germanium-based substrate film 1502 (formed, e.g., using low-pressure chemical vapor deposition at about 300 degrees Celsius), is disposed on the ILD layer 1541. Portions 1547, 1543 and 1545 of the amorphous Germanium-based substrate film 1502 have been replaced with an insulative material, such as Silicon dioxide, and portions 1522 and 1524 have been doped to form source/drain regions for the TFT 1520. Portions 1540 and 1526 of the amorphous Germanium-based substrate film 1502 have been crystallized using, for example, metal induced lateral crystallization at a relatively low temperature (e.g., forming an intrinsic material 1540 for the photodetector 1510 and a channel region 1526 for the TFT 1520).

Referring to the Germanium-based photodetector 1510, a high-k dielectric material 1542 is disposed on the crystallized Germanium portion 1540 of the Germanium-based substrate film 1502. Conductive materials 1562 and 1560 are in electrical contact with the crystallized Germanium portion 1540. In response to light 1550 incident upon the Germanium-based photodetector 1510, electrons and holes generated in the crystallized Germanium portion 1540 effect current flow between the conductive materials 1562 and 1560.

Referring now to the Germanium-based TFT 1520, a high-k dielectric film having portions 1511, 1503 and 1512 disposed thereon and separated by conductive material portions 1560 and 1561. A Germanium-based conductive electrode 1506 is disposed on high-k dielectric material portion 1503, an insulative material 1507, 1509 and 1508 is disposed on each of high-k dielectric film portions 1511, 1503 and 1512, respectively. Current generated in the crystallized Germanium portion 1540 is electrically coupled to the conductive material 1561 via source/drain regions 1522 and 1524, with a conductive channel being formed that channel region 1526 in response to a voltage applied to the conductive electrode 1506.

In another example embodiment of the present invention, a high-k dielectric is directly deposited (e.g., no intervening layer) on a Ge-rich surface area that has been treated to inhibit the formation of an undesirable low-k interface layer between the deposited high-k dielectric and the Ge-rich surface area. In one implementation, the Ge-rich surface is treated with one or more of an aqueous rinse (e.g., with deionized water), a vapor HF etch, or a high vacuum anneal.

The treatment removes and/or chemically-modifies any native GeOx layer present on the Ge surface. In some instances, this treatment step is followed by reoxidation of the Ge-rich surface to prepare a clean and uniform (and very thin, typically less than 1 nm in thickness) $GeO_2$ layer, prior to the high-k dielectric deposition. This intentionally-formed oxide is used to protect the Ge-rich surface prior to the high-k film deposition. This approach has been found to be useful, for example, if the device must be queued for extended periods prior to deposition of the high-k film deposition, in which case the $GeO_2$ layer is subsequently removed in a vacuum anneal or chemical stripping step immediately prior to high-k deposition. Alternatively, the $GeO_2$ surface passivation may be decomposed as part of the high-k gate dielectric formation process, as is described in more detail below.

In one implementation, the high-k dielectric is produced by direct deposition of a metal oxide-based material (e.g., ZrO2, HfO2, La2O3, TiO2, Ta2O5 or related metal-silicates, metal-germanates or metal-aluminates) onto a prepared Ge surface. For instance, atomic layer deposition (ALD), chemical vapor deposition (CVD), or molecular beam epitaxy (MBE) may be used for deposition. In another implementation, the high-k dielectric is produced by deposition of a metal layer or intermetallic compound layer (e.g., metal silicide, metal Germanide or metal Aluminide), which is subsequently oxidized. In one instance, the oxidation is effected by exposing the deposited metal layer (or intermetallic compound layer) to an oxidizing ambient, such as via thermal oxidation, plasma oxidation and/or UV-ozone oxidation. In another instance, the oxidation is effected using a solid-state reaction between a pre-existing $GeO_2$ surface passivation layer and the metal or intermetallic layer. In still another instance, a combination of two or more of the oxidation approaches discussed above is used.

In another example embodiment, the above-discussed direct deposition approach is used for forming an epitaxial gate dielectric layer. For instance, a $ZrO_2$ (or similar) gate dielectric layer can be grown using ALD onto a vapor HF treated Ge surface while inhibiting the formation of an amorphous GeOx interface layer. In connection with this example embodiment, such single crystal-like epitaxial metal oxide gate dielectrics will avoid fast diffusion paths and high densities of electronic trap states associated with grain boundaries in polycrystalline gate dielectric films. Truly coherent gate dielectric/Ge interfaces prepared by epitaxial growth of the high-k material, as discussed above, can be implemented for producing devices having low interface state densities.

In another example embodiment, the above-discussed approach involving oxidation of a deposited metal (or intermetallic) film is used to produce an amorphous gate dielectric layer. For instance, amorphous $ZrO_2$-containing gate dielectrics can be prepared using by room temperature UV-ozone oxidation of deposited Zr on both de-ionized water rinsed and vapor HF treated Ge surfaces. In connection with this example embodiment, such amorphous gate dielectrics have been found to avoid fast diffusion paths and high densities of electronic trap states associated with grain boundaries in polycrystalline gate dielectric films.

In another implementation, the oxidation process discussed above is controlled so that some $GeO_2$ is incorporated into the gate dielectric layer, producing a graded composition of the dielectric. The graded dielectric has a $GeO_2$-rich interface that faces the Ge-rich surface, and a metal oxide-rich interface that is present at an opposite surface of the dielectric layer (e.g., where a gate electrode metal interface may exist). Such a graded structure may be implemented, for example, to minimize scattering of carriers in the Ge channel by reducing the Ge/high-k dielectric interface state density.

In another implementation, a Ge channel vertical MOSFET having transistor channels running along vertical surfaces of a patterned Ge-containing semiconductor film is formed using one or more of the approaches discussed above. A gate dielectric deposition process is used for controlled-thickness deposition over convolved surfaces. ALD and/or a high-conformality CVD process is used either to directly deposit a metal oxide-based gate dielectric onto the vertical Ge channel surfaces, or to deposit a metal layer (e.g., Ti, Ta) which is subsequently oxidized using, for example, one or more of the approaches discussed above. In another implementation, a gate dielectric is formed using epitaxial growth onto the vertical Ge channel surface.

In another example embodiment of the present invention, a pure or nearly pure, single-crystal-like Ge surface layer is formed on a single-crystalline silicon wafer with an interposed insulator layer that serves to electrically isolate the Ge surface layer from the bulk of the wafer. This approach can be implemented in the formation of a variety of devices, including those discussed above and Ge-channel MOSFET devices that incorporate a deposited gate dielectric.

In one implementation, one or more Si—Ge (e.g., $Si_{1-x}Ge_x$) alloy is oxidized to selectively form $SiO_2$, for the interposed insulator discussed above. In connection with this example embodiment, it has been found that the composition of Ge in the remaining $Si_{1-x}Ge_x$ alloy in the vicinity of the $SiO_2$/alloy interface is enriched. In one implementation, silicon oxidation is carried out to prepare a nearly pure Ge layer immediately adjacent to an amorphous $SiO_2$ insulator layer. Enriched and/or pure Ge layers are particularly useful, for example, for implementation as the Ge-rich surface materials discussed above. For instance, a selective oxidation process can be used to prepare germanium-on-insulator (GeOI) structures that are useful in the fabrication of Ge-channel MOS transistors.

Figure 17:
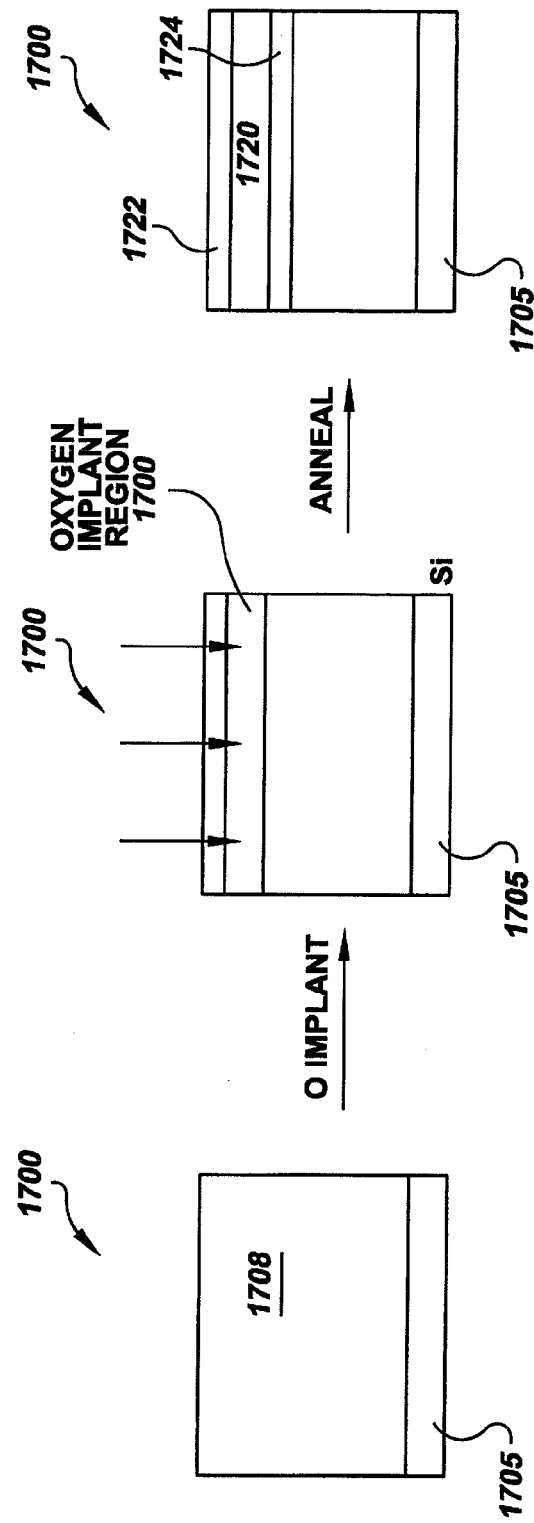
FIGS. 17A-17C show a semiconductor device including a Germanium-on-insulator (GeOI) structure at stages of manufacture, according to another example embodiment of the present invention.

FIGS. 17A-C show a semiconductor device 1700 being manufactured in connection with a GeOI approach using selective oxidation, according to another example embodiment of the present invention. Referring to FIG. 17A, an epitaxial layer of a Silicon-Germanium (Si—Ge) alloy layer 1708 is formed on a silicon substrate 1705. In FIG. 17B, oxygen ions are implanted (represented by arrows) into an epitaxial layer to form an oxygen implant region 1710 in the Si—Ge alloy layer 1708. After the oxygen implant region 1710 is formed, the device 1700 is annealed at high temperature to react the implanted oxygen with silicon in the implanted region of the Si—Ge alloy layer 1708. The annealing forms an $SiO_2$ region 1720 and Ge-rich regions 1722 and 1724 in the Si—Ge layer 1708. The oxygen dose and the projected range of the implantation (depth of the centroid of the implanted oxygen concentration distribution), a nearly pure Ge-rich region (layer) 1722 may be formed on the surface of the waver 1700.

The Ge-rich region 1722 is then implemented in one or more of a variety of applications, for example, such as those discussed above. In one implementation, Germanium is epitaxially grown on the oxidation-formed Ge-rich layer 1722, for example, using chemical vapor deposition or molecular beam epitaxy, in a subsequent process step to achieve the a pure Ge surface layer.

Figure 18:
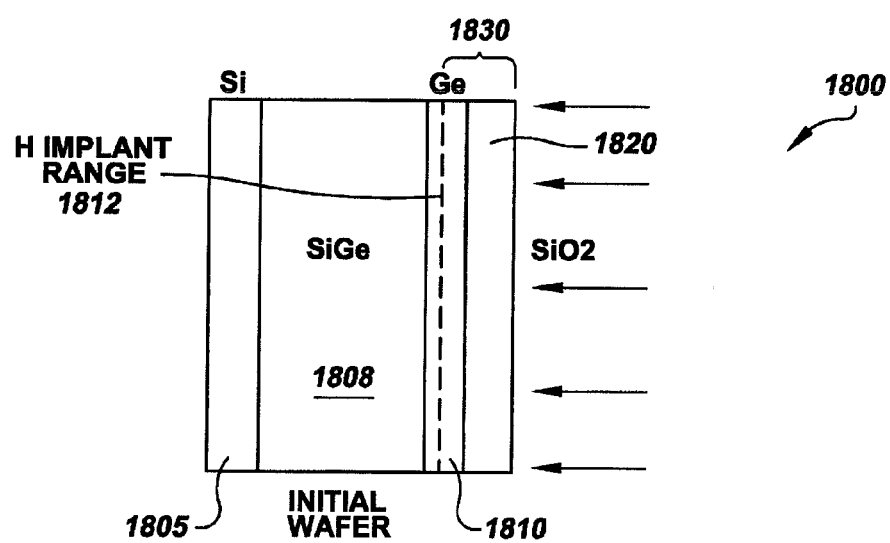
FIG. 18 shows a semiconductor device having a GeOI structure being cleaved from a wafer, according to another example embodiment of the present invention.

FIG. 18 shows another GeOI approach involving selective oxidation and cleaving of a GeOI structure, according to another example embodiment of the present invention. The silicon surface 1805 of a silicon wafer 1800 is coated with an epitaxial Si—Ge alloy layer 1808. The wafer 1800 is oxidized at an elevated temperature, for example, via exposure to molecular oxygen vapor of a controlled partial pressure, and an SiO$_2$ surface oxide layer 1820 and a Ge-rich alloy region 1810 beneath the oxide layer are formed. In another implementation, the Si—Ge alloy layer 1808 is selectively oxidized in a manner that forms a nearly pure Ge layer 1810 immediately adjacent to the SiO$_2$ layer 1820.

A wafer bonding method is then applied to remove the SiO$_2$ surface layer 1820 and Ge-rich alloy layer 1810 from the initial wafer substrate. In one implementation, a gas such as hydrogen is implanted to a level shown by H implant range 1812 using a controlled implant energy and dose. The wafer 1800 is then annealed at high temperature to produce voids at a desired depth (e.g., range 1812) beneath the SiO$_2$ surface 1820 of the oxidized wafer. These voids facilitate cleavage of a portion 1830 of wafer at the voids, the cleaved portion including the Ge-rich alloy region 1810 and the SiO$_2$ surface layer 1820.

In one implementation, the cleaved portion 1830 of the wafer 1800 is placed with the SiO$_2$ layer 1820 on a surface of a final wafer. The arrangement is annealed at high temperature to produce a strong chemical bond, which results in the Ge-rich layer 1810 becoming the new surface of the final wafer, separated from other portions of the wafer by the SiO$_2$ layer. In another implementation, Germanium is epitaxially grown onto the oxidation-formed enriched alloy surface layer 1810, for example, using chemical vapor deposition or molecular beam epitaxy, to form a nearly pure layer of Germanium.

The oxidation and cleaving approach discussed above in connection with FIG. 18 can be implemented for a variety of devices. For instance, GeOI structures formed using this approach can be used in the heterogeneous integration of transistor devices; multiple layers of high-k dielectric Ge-channel MOSFETs and/or IGFETS are fabricated in the above the silicon wafer surface.

Figure 19:
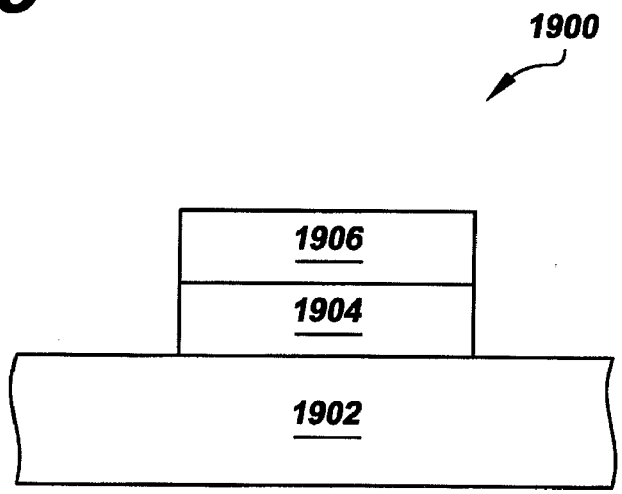
FIG. 19 shows a semiconductor device having a GeOI structure, according to another example embodiment of the present invention.

FIG. 19 shows another GeOI structure 1900 having an interposed insulative layer 1904 between a Silicon-containing layer 1902 and a Germanium-containing layer 1906, according to another example embodiment of the present invention. Insulative materials such as metal oxide and/or a similar lattice-matched insulating material are used for the insulative layer 1904. The insulative layer 1904 has a structure and atomic spacings that are similar to at least one of the Silicon-containing layer 1902 and the Germanium-containing layer 1906. The Germanium-containing layer 1906 is formed using an approach such as epitaxial growth over the insulative layer 1904, which mimics the structure of the insulative layer on which it is grown. In one implementation, an insulative layer including cerium oxide (CeO$_2$, e.g., in cubic form) is used in the insulative layer 1904 and exhibits interatomic spacings that are similar to that of Silicon. In another implementation, an insulative layer including Lanthanum oxide (La$_2$O$_3$, e.g., in cubic form) is used in the insulative layer 1904 and exhibits interatomic spacings that are similar to that of Germanium crystals in the Germanium-containing layer 1906. In still another implementation, the insulative layer 1904 is epitaxially deposited on the Silicon-containing layer 1902 (e.g., using one or more of ALD, CVD, or MBE).

EXAMPLE DATA

Figure 16:
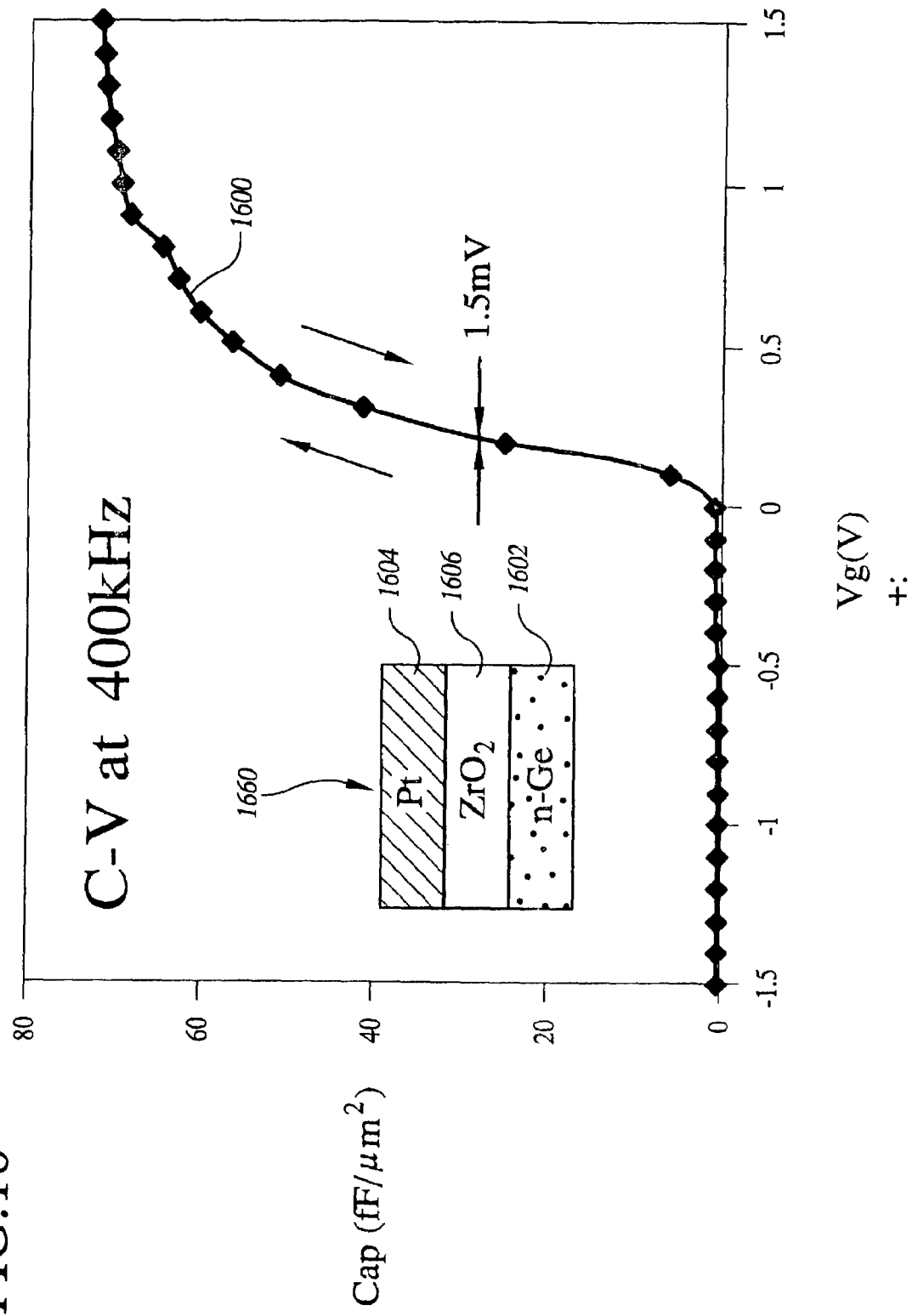
FIG. 16 shows example data including capacitance versus voltage applied to a gate for a semiconductor device with a high-k dielectric material between a gate and a Germanium substrate material, according to another example embodiment of the present invention.

FIG. 16 shows an example capacitance versus voltage curve 1600 as applied to a gate for a semiconductor device having a high-k dielectric material between a gate and a Germanium-based substrate material, according to another example embodiment of the present invention. Using the device in FIG. 1 as an example, a voltage applied to the upper electrode 104 is shown on the horizontal axis, with the resulting capacitance via the dielectric material to the lower electrode 102 shown on the vertical axis. Using similar numbering, an inset example capacitive structure 1660 shows an upper electrode including platinum 1604 disposed on a high-k insulative dielectric material 1606 on an N-doped germanium substrate material 1602. Using the inset example, the resulting curve 1600 shows hysteresis estimation with a gate voltage (V$_g$) of about 1.5 mV causing a change in capacitance at about 400 kHz.

While the present invention has been described with reference to several particular example embodiments, those skilled in the art will recognize that many changes may be made thereto without departing from the spirit and scope of the present invention, which is set forth in the following claims.

What is claimed is:

1. A field-effect transistor (FET) device comprising:
a gate electrode;
a channel region including a Ge-rich surface material facing the gate electrode; and
a multiple-layer dielectric region located between the gate electrode and the channel region and including an interface layer having an effective thickness not greater than about 10 Angstroms $T_{Ox,Eq}$ that is stabilized to and in contact with the channel region and including a high-permittivity dielectric material that faces, lies against, is stable with, and contacting the interface layer.

2. The FET device of claim 1, further comprising a Germanium-on-insulator insulated-gate FET (IGFET) structure including the channel region and an insulator layer immediately adjacent the channel region and separated from the gate electrode by the channel region, wherein the dielectric region is a gate dielectric layer for the IGFET structure.

3. The FET device of claim 2, wherein the channel region includes a ridge portion having at least two surfaces that face the gate electrode and wherein the dielectric region is between the gate electrode and the at least two surfaces of the ridge portion.

4. The FET device of claim 1, further comprising source/drain regions separated by the channel region, the gate electrode being adapted to control current flow between the source/drain regions via the channel region.

5. The FET device of claim 4, wherein the gate electrode has opposing sidewalls above the source/drain regions and wherein the source/drain regions are self-aligned to the opposing sidewalls of the gate electrode.

6. The FET device of claim 4, wherein the gate electrode has opposing sidewalls above the source/drain regions and wherein at least one of the source/drain regions extends below at least one of the opposing sidewalls and the gate electrode.

7. The FET device of claim 4, wherein the gate electrode has opposing sidewalls above the source/drain regions and wherein at least one of the source/drain regions is laterally offset from and does not extend below the opposing sidewalls of the gate electrode.

8. The FET device of claim 4, further comprising an elevated source/drain junction region extending over one of the source/drain regions and laterally adjacent to the gate electrode.

9. The FET device of claim 1, wherein the gate electrode has a fin-shaped portion and is part of a FinFET structure including the fin-shaped portion, the channel region and the dielectric region.

10. The FET device of claim 1, further comprising:
a second dielectric region separated from said dielectric region by the channel region; and
a second gate electrode separated from the channel region by the second dielectric region, said gate electrode and the second gate electrode being adapted for coupling signals to the channel region for controlling current flow therein.

11. The FET device of claim 1, wherein the gate electrode extends around at least two sides of the channel region.

12. A semiconductor device, comprising:
a Ge-based surface material having a composition that is preponderantly Germanium;
a multiple-layer dielectric region in contact with the Ge-based surface material and including an interface layer having an effective thickness not greater than about 10 Angstroms $T_{Ox,Eq}$ that is stabilized to and in contact with the Ge-based surface material and including a-high-permittivity dielectric material that faces, lies against and is stable with the interface layer.

13. The semiconductor device of claim 12, wherein the Ge-based surface material contains at least sixty percent Germanium.

14. The semiconductor device of claim 12, further including an optical-electronic device including a GaAs-based substrate material lattice-matched with and lying against the Ge-based surface material.

15. The semiconductor device of claim 12, further including an optical device including an optical detector having a GaAs-based substrate material lattice-matched with and lying against the Ge-based surface material.

16. The semiconductor device of claim 12, further including an optical device including an optical diode emitter having a GaAs-based substrate material lattice-matched with and lying against the Ge-based surface material.

17. The semiconductor device of claim 12, further including a micro-electro-mechanical system (MEMS) device, wherein the Ge-based surface material contains at least sixty percent Germanium.

18. The FET device of claim 1, wherein the interface layer includes at least one of metal oxides and oxynitrides.

19. The FET device of claim 1, wherein the interface layer includes one of germanium oxynitrides and zirconium oxynitrides.

20. The FET device of claim 1, wherein the interface layer includes hafnium containing oxides and oxynitrides.

21. The FET device of claim 1, wherein the interface layer is a diffusion barrier.

22. The semiconductor device of claim 12, wherein the interface layer includes at least one of metal oxides and oxynitrides.

23. The semiconductor device of claim 12, wherein the interface layer includes one of germanium oxynitrides and zirconium oxynitrides.

24. The semiconductor device of claim 12, wherein the interface layer includes hafnium containing oxides and oxynitrides.

25. The semiconductor device of claim 12, wherein the interface layer is a diffusion barrier.

* * * * *